(12) United States Patent
Sakurai et al.

(10) Patent No.: US 8,575,052 B2
(45) Date of Patent: Nov. 5, 2013

(54) DIELECTRIC CERAMIC, METHOD FOR PRODUCING DIELECTRIC CERAMIC, AND ELECTRONIC COMPONENT

(75) Inventors: Toshio Sakurai, Tokyo (JP); Tomohiro Arashi, Tokyo (JP); Hisashi Kobuke, Tokyo (JP); Takahiro Nakano, Tokyo (JP); Tomoko Nakamura, Tokyo (JP); Yasuharu Miyauchi, Tokyo (JP)

(73) Assignee: TDK Corporation, Tokyo (JP)

( * ) Notice: Subject to any disclaimer, the term of this patent is extended or adjusted under 35 U.S.C. 154(b) by 133 days.

(21) Appl. No.: 13/168,254

(22) Filed: Jun. 24, 2011

(65) Prior Publication Data

US 2012/0004090 A1 Jan. 5, 2012

(30) Foreign Application Priority Data

Jun. 30, 2010 (JP) ................................. 2010-150129
Jun. 30, 2010 (JP) ................................. 2010-150216

(51) Int. Cl.
*C04B 35/20* (2006.01)

(52) U.S. Cl.
USPC ............ 501/122; 264/614; 428/701; 428/702

(58) Field of Classification Search
USPC .................... 501/122; 428/701, 702; 264/614
See application file for complete search history.

(56) References Cited

U.S. PATENT DOCUMENTS

| | | | | |
|---|---|---|---|---|
| 7,232,781 B2 * | 6/2007 | Ishitobi et al. | ................ | 501/136 |
| 7,351,674 B2 * | 4/2008 | Mori et al. | ...................... | 501/32 |
| 7,368,408 B2 * | 5/2008 | Mori et al. | ..................... | 501/134 |
| 7,417,001 B2 * | 8/2008 | Mori et al. | ....................... | 501/32 |
| 7,439,202 B2 * | 10/2008 | Mori et al. | ..................... | 501/134 |
| 8,168,555 B2 | 5/2012 | Suzuki et al. | | |
| 2002/0030573 A1 | 3/2002 | Mori et al. | | |
| 2007/0128450 A1 * | 6/2007 | Mori et al. | ..................... | 428/432 |
| 2008/0253954 A1 * | 10/2008 | Moriya et al. | ................ | 423/331 |
| 2010/0046137 A1 * | 2/2010 | Adachi | ....................... | 361/301.4 |
| 2010/0197478 A1 | 8/2010 | Suzuki et al. | | |

FOREIGN PATENT DOCUMENTS

| | | |
|---|---|---|
| CN | 1334256 A | 2/2002 |
| CN | 101754938 A | 6/2010 |
| JP | A-2009-132579 | 6/2009 |
| WO | WO 2009/014092 A1 | 1/2009 |

OTHER PUBLICATIONS

Sasikala T.S. et al., "Effect of Lithium Magnesium Zinc Borosilicate Glass Addition on Densification Temperature and Dielectric Properties of $Mg_2SiO_4$ Ceramics", Journal of Materials Science, United Kingdom, Springer, Feb. 2010, vol. 21, pp. 141-144, Published online Apr. 7, 2009.

(Continued)

*Primary Examiner* — Karl Group
(74) *Attorney, Agent, or Firm* — Oliff & Berridge, PLC

(57) ABSTRACT

Provided is a dielectric ceramic that includes a main component which contains $Mg_2SiO_4$ and additives which contain a zinc oxide and a glass component, in which, in X-ray diffraction. The peak intensity ratio, $I_B/I_A$, of the X-ray diffraction peak intensity $I_B$ of zinc oxide remaining unreacted, for which 2θ is between 31.0° and 32.0° and between 33.0° and 34.0°, with respect to the peak intensity $I_A$ of $Mg_2SiO_4$ as the main phase, for which 2θ is between 36.0° and 37.0°, is 10% or less. The dielectric ceramic has a relative density of 96% or greater.

10 Claims, 3 Drawing Sheets

(56) References Cited

OTHER PUBLICATIONS

Sasikala T.S. et al., "Forsterite-based Ceramic-glass Composites for Substrate Applications in Microwave and Millimeter Wave Communications", Journal of Alloys and Compounds, NR, Elsevier, Aug. 11, 2008, vol. 461, pp. 555-559, Available online, Jul. 27, 2007.

Aug. 7, 2012 Notice of Rejection issued in Japanese Patent Application No. 2010-150129 (with translation).

Aug. 7, 2012 Notice of Rejection issued in Japanese Patent Application No. 2010-150216 (with translation).

Nov. 29, 2012 Notification of First Office Action issued in Chinese Application No. 201110185021.01.

* cited by examiner

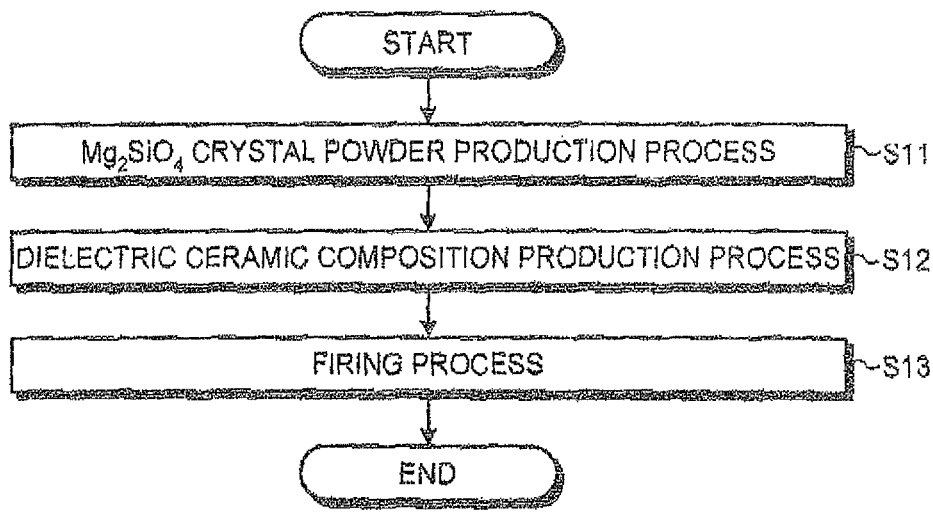
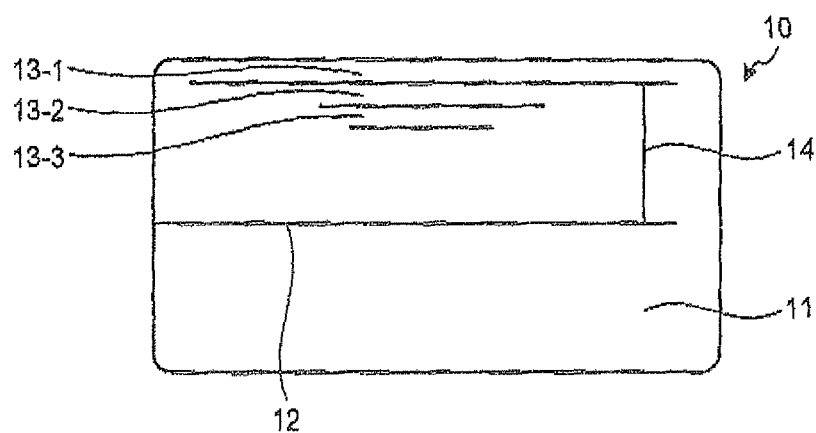

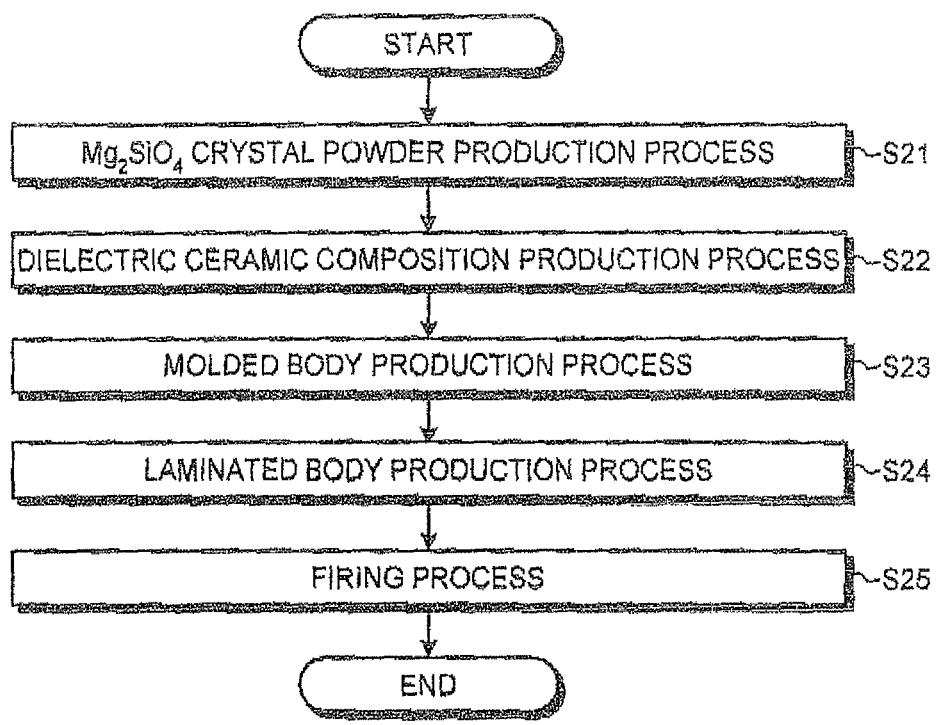
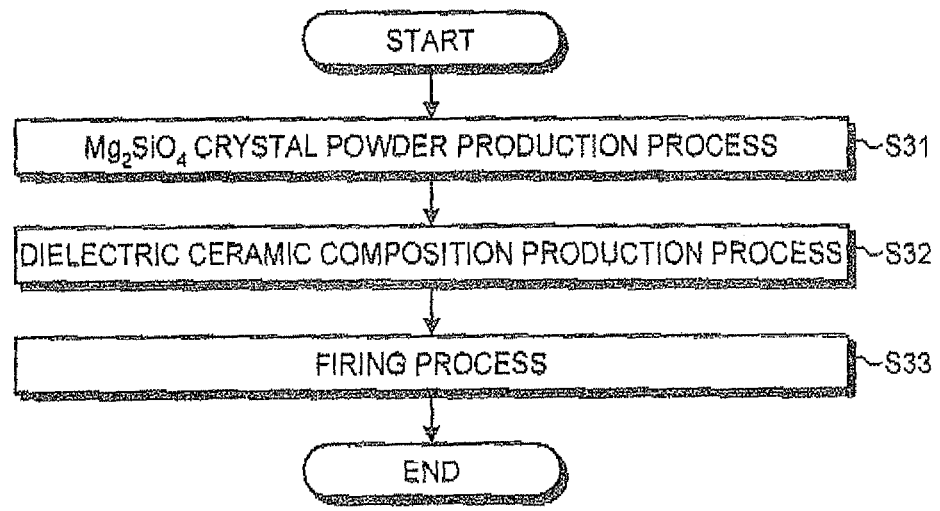

DIELECTRIC CERAMIC, METHOD FOR PRODUCING DIELECTRIC CERAMIC, AND ELECTRONIC COMPONENT

CROSS-REFERENCE TO RELATED APPLICATIONS

This application is based upon and claims the benefit of priority from Japanese Patent Application Nos. 2010-150129 and 2010-150216, both filed on Jun. 30, 2010, the entire contents of which are incorporated herein by reference.

BACKGROUND OF THE INVENTION

1. Field of the Invention

The present invention relates to a dielectric ceramic which is used in electronic components that are used in high frequency region such as microwaves and milliwaves, a method for producing the dielectric ceramic, and an electronic component using the dielectric ceramic.

2. Description of the Related Art

In recent years, a high-frequency band referred to as so-called quasi-microwaves of about several hundred MHz to several GHz is used for mobile communication equipment such as mobile phones, the demand for which is ever increasing. Therefore, electronic components that are used in mobile communication equipment, such as capacitors, filters, resonators and circuit boards, are also required to have general characteristics appropriate for the use in high-frequency bands.

Circuit boards, which constitute one class of the electronic components used in high-frequency bands, include conductors such as electrodes or wiring (hereinafter, referred to as "conductor materials"), and have built-in LC filters which are each formed from a combination of a magnetic body and a dielectric body, built-in capacitors which are each formed from a combination of a high dielectric constant material and a low dielectric constant material, and the like. Thus, these circuit boards construct circuits with LC filters, capacitors and the like.

In a circuit board, it is needed to lower the relative permittivity ∈r of the board in order to reduce signal delay that is attributable to the wiring capacitance in the wiring layer of the circuit board. Furthermore, since high frequency signals are not to be attenuated in a circuit board, it is necessary to make the Qf factor of the substrate large (that is, reducing the dielectric loss). Therefore, a dielectric material having low relative permittivity ∈r in the use frequency and having a large Qf factor is demanded as a material for circuit boards. Q represents the reciprocal of tangent of the loss angle δ, tan δ, which is the difference between the actual phase difference between current and voltage and the ideal phase difference of 90° between current and voltage in a dielectric substance, and f represents the resonant frequency. The Qf factor is represented by the product of the quality factor, Q=1/tan δ, and the resonant frequency f, and when the Qf factor increases, the dielectric loss decreases.

Generally, materials having low dielectric constants in many cases exhibit small dielectric losses, and those materials are used for devices in the microwave region. For example, an LC filter is formed by simultaneously firing a high dielectric constant material and a low dielectric constant material. In an LC filter, when a low dielectric constant material having a high Q factor is used so that the ceramic material at the part constituting the L unit can have a high self-resonant frequency, and a high dielectric constant material having favorable temperature characteristics is used for the C unit, an LC element having a high Q factor and having favorable temperature characteristics can be realized.

As such dielectric materials, for example, a dielectric ceramic composition containing forsterite ($Mg_2SiO_4$) as a main component, and zinc oxides, boron oxides, alkaline earth metal oxides, copper compounds and lithium compounds as additives (hereinafter, referred to as a "forsterite-based composition"), has been suggested (see, for example, Japanese Laid-open Patent Publication No. 2009-132579). The forsterite composition can be fired at a temperature lower than the melting point of metal silver (Ag) or an Ag-based alloy (hereinafter, referred to as an Ag-based metal), which are conductor materials, and thus the mechanical strength can be increased when the composition is fabricated into a substrate. Therefore, the forsterite composition is appropriate as a dielectric material for circuit boards.

In other wards, since the sintering temperature of a forsterite-based composition is about 1,000° C. or lower, and this sintering temperature is lower than the sintering temperatures of conventional dielectric ceramic compositions, the forsterite-based composition has a lower melting point as compared with the conductor materials that have been traditionally used, such as palladium (Pd) or platinum (Pt), and has a low electrical resistance, and an inexpensive Ag-based metal can be used as a conductor material. Accordingly, a forsterite-based composition can be co-fired at a low temperature (a temperature lower than the melting points of Ag-based metals). Therefore, when a forsterite-based composition is used to form a circuit board, the forsterite-based composition is used as a low temperature co-fired ceramic (LTCC) which can be co-fired with a conductor material such as an Ag-based metal, and a circuit with LC filters, capacitors or the like can be fainted in different layers.

However, conventional forsterite-based compositions have a problem that because sintering aids such as zinc oxide, which are added to forsterite-based compositions as sintering aids, remain unreacted after the main firing process, the resulting dielectric ceramics have large dielectric losses.

Furthermore, there is also a problem that when the amount of addition of sintering aids is reduced, and thereby the amount of unreacted sintering aids is decreased, sinterability of the fired material that is obtained by firing a forsterite-based composition is impaired, the dielectric loss of the substrate is increased, and thereby the mechanical strength of the substrate is deteriorated.

Accordingly, there is a demand for a dielectric ceramic having excellent dielectric properties, which may be obtained by preventing any unreacted sintering aids from remaining behind after firing a forsterite-based composition at a low temperature, and also by securing sinterability by causing the sintering aids to undergo complete reaction.

SUMMARY OF THE INVENTION

A dielectric ceramic according to an aspect of the present invention includes a main component which contains $Mg_2SiO_4$; and additives which contain a zinc oxide and a glass component, wherein in X-ray diffraction, a peak intensity ratio $I_B/I_A$ is 10% or less where IA is an X-ray diffraction peak intensity of $Mg_2SiO_4$ as a main phase for which 2θ is between 36.0° and 37.0° and $I_B$ is an x-ray diffraction peak intensity of zinc oxide remaining unreacted for which 2θ is between 31.0° and 32.0° and between 33.0° and 34.0°, and the dielectric ceramic has a relative density of 96% or greater.

A dielectric ceramic according to another aspect of the present invention includes a main component which contains $Mg_2SiO_4$; and additives which contain a zinc oxide, a glass component, and at least one of an aluminum oxide and a titanium oxide.

An electronic component according to still another aspect of the present invention includes a dielectric layer formed of the dielectric ceramic according to the invention.

A method according to still another aspect of the present invention is for producing a dielectric ceramic containing a main component which contains $Mg_2SiO_4$ and additives which contain a zinc oxide and a glass component. The method includes a dielectric ceramic composition production process that includes mixing a raw material powder of magnesium oxide and a raw material powder of silicon dioxide, heat treating the mixture to produce an $Mg_2SiO_4$ crystal powder, adding the zinc oxide and the glass component as additive raw material powders to the $Mg_2SiO_4$ crystal powder, and thereby obtaining a dielectric ceramic composition; and a firing process that includes firing the dielectric ceramic composition at a temperature of from 800° C. to 1000° C. in an oxygen atmosphere, and thereby obtaining a sintered body, wherein in X-ray diffraction, a peak intensity ratio $I_B/I_A$, is 10% or less where IA is an X-ray diffraction peak intensity of $Mg_2SiO_4$ as a main phase of the sintered body for which 2θ is, between 36.0° and 37.0° and $I_B$ is an X-ray diffraction peak intensity of zinc oxide remaining unreacted for which 2θ is between 31.0° and 32.0° and between 33.0° and 34.0°, and the dielectric ceramic has a relative density of 96% or greater.

A method according to still another aspect of the present invention is for producing a dielectric ceramic containing a main component which contains $Mg_2SiO_4$ and additives which contain a zinc oxide and a glass component as well as at least one of an aluminum oxide and a titanium oxide. The method includes a dielectric ceramic composition production process that includes mixing a raw material powder of magnesium oxide and a raw material powder of silicon dioxide, heat treating the mixture to produce an $Mg_2SiO_4$ crystal powder, adding the at least one of the aluminum oxide and the titanium oxide, the zinc oxide and the glass component as additive raw material powders to the $Mg_2SiO_4$ crystal powder, and thereby obtaining a dielectric ceramic composition; and a firing process that includes firing the dielectric ceramic composition at a temperature of from 800° C. to 1000° C. in an oxygen atmosphere, and thereby obtaining a sintered body.

The above and other features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 1 is a flow chart showing a method for producing a dielectric ceramic according to a first embodiment of the present invention;

FIG. 2 is a conceptual cross-sectional diagram schematically showing an embodiment of using an LC filter as the electronic component according to the first embodiment of the present invention;

FIG. 3 is a flow chart showing an example of the method for producing an electronic component according to the first embodiment of the present invention;

FIG. 4 is a flow chart showing a method for producing a dielectric ceramic according to a second embodiment of the present invention;

DETAILED DESCRIPTION OF THE PREFERRED EMBODIMENTS

Figure 5:
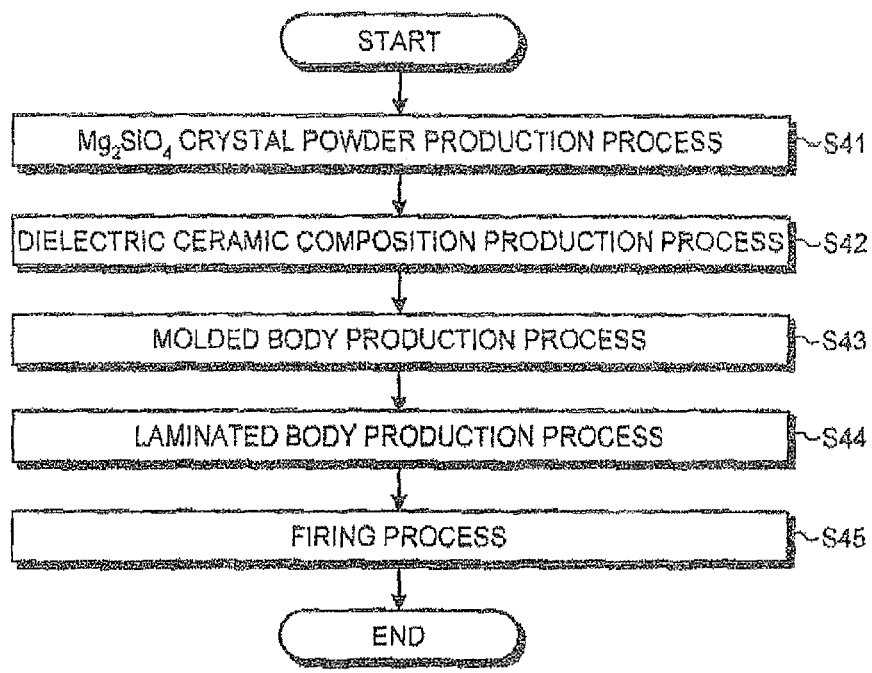
FIG. 5 is a flow chart showing an example of the method for producing an electronic component according to the second embodiment of the present invention.

Hereinafter, embodiments for suitably carrying out the present invention (hereinafter, referred to as embodiments) will be described in detail. The present invention is not intended to be limited to the subject matters described in the following embodiments. Furthermore, the constituent elements in the embodiments described below include those elements that can be easily conceived by a person having ordinary skill in the art, those elements that are substantially identical, and those elements that are in the so-called scope of equivalence. Furthermore, the constituent elements disclosed in the embodiments described below can be appropriately combined.

First Embodiment

Dielectric Ceramic

A dielectric ceramic according to a first embodiment of the present invention contains a main component which includes $Mg_2SiO_4$, and additives which include ZnO and a glass component, and in the X-ray diffraction analysis of the dielectric ceramic, the peak intensity ratio, of the X-ray diffraction peak intensity $I_B$ of zinc oxide remaining unreacted, for which 2θ is between 31.0° and 32.0° and between 33.0° and 34.0°, with respect to the peak intensity $I_A$ of $Mg_2SiO_4$ as the main phase, for which 2θ is between 36.0° and 37.0°, is 10% or less, while the relative density is 96% or greater.

According to the present embodiment, the term dielectric ceramic composition means a raw material composition of a dielectric ceramic, and the term dielectric ceramic means a sintered body obtainable by sintering a dielectric ceramic composition. Furthermore, sintering is a phenomenon in which when a dielectric ceramic composition is heated, the dielectric ceramic composition turns into a sintered body (dielectric ceramic), and forms a dense article. In general, the density, mechanical strength and the like of a sintered body (dielectric ceramic) become larger, as compared with the properties of a dielectric ceramic composition prior to heating. Furthermore, the term sintering temperature means the temperature of a dielectric ceramic composition at which the dielectric ceramic composition is sintered. The term firing means a heating treatment intended for sintering, and the firing temperature is the temperature of an atmosphere to which the dielectric ceramic composition is exposed at the time of the heating treatment.

An evaluation on whether a dielectric ceramic composition can be fired at a low temperature (low temperature sinterability) can be carried out by firing the dielectric ceramic composition while slowly lowering the firing temperature, and determining whether the dielectric ceramic composition has been sintered to the extent that the dielectric ceramic according to the present embodiment can acquire the desired dielectric high-frequency characteristics. The dielectric properties for the dielectric ceramic according to the present embodiment can be evaluated based on the Qf factor, changes in the resonant frequency with changes in temperature (temperature coefficient of the resonant frequency, τf), and the relative permittivity, ∈r. The Qf factor and the relative permittivity ∈r can be measured according to the Japan Industrial Standards "Testing method for dielectric properties of fine ceramics at microwave frequency (JIS R1627, 1996).

Main Component

The dielectric ceramic according to the present embodiment contains $Mg_2SiO_4$ (forsterite) as a main component.

$Mg_2SiO_4$ as a simple substance has a Qf factor of 200,000 GHz or greater and has a small dielectric loss, and therefore, $Mg_2SiO_4$ has a function of decreasing the dielectric loss of a dielectric ceramic. Furthermore, since $Mg_2SiO_4$ has a relative permittivity ∈r of as low as about 6 to 7, the substance also has a function of decreasing the relative permittivity ∈r of a dielectric ceramic. Here, the dielectric loss is a phenomenon in which a portion of high-frequency energy is dissipated in the form of heat. The magnitude of the dielectric loss is expressed as the reciprocal Q of tangent of the loss angle δ, tan δ, that is, Q=1/tan δ, in which the loss angle represents the difference between the actual phase difference between current and voltage and the ideal phase difference of 90° between current and voltage, in a dielectric substance. The evaluation of the dielectric loss of a dielectric ceramic is carried out using the Qf factor, which is the product of this Q and the resonant frequency f. When the dielectric loss decreases, the Qf factor increases, whereas when the dielectric loss increases, the Qf factor decreases. Since the dielectric loss means a power loss in high-frequency devices, it is preferable that the Qf factor of a dielectric ceramic be large. In the present embodiment, the evaluation of the dielectric loss is carried out using the Q factor.

From the viewpoint of decreasing the dielectric loss of a dielectric ceramic, the proportion of $Mg_2SiO_4$ in the main component is preferably 100 parts by mass. However, in order to adjust the relative permittivity ∈, a main component other than $Mg_2SiO_4$ can be used in combination with $Mg_2SiO_4$. Examples of the main component other than $Mg_2SiO_4$ include magnesium titanate ($MgTiO_3$), which has a relative permittivity ∈r of approximately 17, and calcium titanate ($CaTiO_3$), which has a relative permittivity sr of approximately 200.

The molar ratio of MgO and $SiO_2$, which constitute $Mg_2SiO_4$, is stoichiometrically such that the ratio of MgO: $SiO_2$ is 2:1; however, the present embodiment is not intended to be limited to this value, and the molar ratio may deviate from the stoichiometric ratio to the extent that the effects of the dielectric ceramic according to the present embodiment are not impaired. For example, the ratio of MgO:$SiO_2$ can be adjusted to be in the range of 1.9:1.1 to 2.1:0.9.

The content of $Mg_2SiO_4$ in the dielectric ceramic according to the present embodiment is preferably the remainder obtained after excluding the contents of various additives that will be described below, from the total amount of the dielectric ceramic. When a dielectric ceramic contains $Mg_2SiO_4$ as a main component under such conditions, the effect of decreasing the dielectric loss and the relative permittivity ∈r may be securely obtained. In addition, when a dielectric ceramic contains a component other than $Mg_2SiO_4$ as another main component as described above, the sum of the main components constitutes the remainder obtained after excluding the contents of various additives from the total amount of the dielectric ceramic.

Additives

The dielectric ceramic according to the present embodiment is constituted to have a composition containing a zinc oxide and a glass component as additives with respect to $Mg_2SiO_4$ as the main component. The additives are used as sintering aids that form a liquid phase when the dielectric ceramic composition is fired. Particularly, the glass component incorporated as en additive plays the role as a liquid phase, and promotes the reactivity between $Mg_2SiO_4$ as the main component and the sintering aids that remain unreacted. Thereby, the amount of sintering aids that remain unreacted in the dielectric ceramic after firing of the dielectric ceramic composition can be reduced, and also, the sintering aids can be made to undergo complete reaction. Therefore, sinterability of the dielectric ceramic is secured. As a result, the Q factor of the resulting dielectric ceramic can be increased, and the dielectric loss can be made small.

Furthermore, when a zinc oxide and a glass component are added to a dielectric ceramic composition as sintering aids that form a liquid phase at the time of firing of the dielectric ceramic composition, and are incorporated into the dielectric ceramic composition as additives, the sintering temperature of the dielectric ceramic composition is decreased. For this reason, when a dielectric ceramic is produced by firing a dielectric ceramic composition, the dielectric ceramic composition can be co-fired with an Ag-based metal at a low temperature (a temperature lower than the melting point of the Ag-based metal), and low temperature firing can be attempted. Also, a decrease in the transverse rupture strength of the dielectric ceramic, which occurs concomitantly with a decrease in the firing temperature of the dielectric ceramic composition, can be suppressed. Therefore, firing of a dielectric ceramic composition at a low temperature (a temperature lower than the melting points of Ag-based metals) can be achieved, while the transverse rupture strength of the resulting dielectric ceramic can be enhanced, as compared with that of those dielectric ceramics that are obtained by firing conventional forsterite-based compositions.

The zinc oxide may be, for example, ZnO or the like, The glass component preferably contains at least one or more glass substances containing $LiO_2$. When the glass component contains $Li_2O$, the glass component further promotes the reactivity of $Mg_2SiO_4$ with unreacted sintering aids, the amount of sintering aids that remain unreacted in the dielectric ceramic after firing of the dielectric ceramic composition can be further reduced, and also, the sintering aids can be made to undergo complete reaction. Accordingly, sinterability of the dielectric ceramic can be more stably secured. Thereby, the Q factor of the resulting dielectric ceramic can be further increased, and the dielectric loss can be further decreased. Also, the dielectric ceramic composition can be co-fired with an Ag-based metal at a low temperature (a temperature lower than the melting point of the Ag-based metal), and still, the transverse rupture strength of the dielectric ceramic can be more stably secured.

Such a glass component is preferably constituted to include, for example, any one or two or more of $SiO_2$—RO—$Li_2O$ (wherein RO contains one or more kinds of alkaline earth metal oxide) glass, $B_2O_3$—RO—$Li_2O$ glass, and $SiO_2$—RO—$Li_2O$—$Al_2O_3$ glass. Examples of the $SiO_2$—RO—$Li_2O$ glass include $SiO_2$—CaO—$Li_2O$ glass, $SiO_2$—SrO—$Li_2O$ glass, $SiO_2$—BaO—$Li_2O$ glass, $SiO_2$—CaO—SrO—$Li_2O$ glass, $SiO_2$—BaO—CaO—$Li_2O$ glass, $SiO_2$—SrO—BaO—$Li_2O$ glass, and $SiO_2$—CaO—SrO—BaO—$Li_2O$ glass. Examples of the B2O3-RO—Li2O glass include B2O3-CaO—Li2O glass, B2O3-SrO—Li2O glass, B2O3-BaO—Li2O glass, B2O3-CaO—SrO—Li2O glass, B2O3-BaO—CaO—Li2Oglass, B2O3-SrO—BaO—Li2O glass, and B2O3-CaO—SrO—Li2O glass. Examples of the $SiO_2$—RO—$Li_2O$—$Al_2O_3$ glass include $SiO_2$—CaO—$Li_2O$—$Al_2O_3$ glass, $SiO_2$—SrO—$Li_2O$—$Al_2O_3$ glass, $SiO_2$—BaO—$Li_2O$—$Al_2O_3$ glass, $SiO_2$—CaO—SrO—$Li_2O$—$Al_2O_3$ glass, $SiO_2$—BaO—CaO—$Li_2O$—$Al_2O_3$ glass, $SiO_2$—SrO—BaO—$Li_2O$—$Al_2O_3$ glass, and $SiO_2$—CaO—SrO—BaO—$Li_2O$—$Al_2O_3$, Among these, $SiO_2$—BaO—CaO—$Li_2O$ glass is preferred.

The content of the zinc oxide, as determined by calculating the mass of the zinc oxide relative to ZnO, is preferably from 8.0 parts by mass to 20 parts by mass, more preferably from 10 parts by mass to 16 parts by mass, and even mare preferably from 12.0 parts by mass to 16.0 parts by mass, relative to 100 parts by mass of the main component. When the dielectric ceramic composition is co-fired with an Ag-based metal, the zinc oxide contributes to the feasibility of firing at a low temperature (a temperature lower than the melting point of the Ag-based metal). For this reason, when the content of the zinc oxide is adjusted to be in the range described above, the dielectric ceramic composition can be stably co-fired with an Ag-based metal at a low temperature (a temperature lower than the melting point of the Ag-based metal).

If the content of the zinc oxide is less than 8.0 parts by mass, there is a tendency that the low temperature sintering effect (that is, the effect of enabling the sintering of a dielectric ceramic composition at a lower temperature) may be insufficient, so that the sintered density of the dielectric ceramic is decreased, and the quality factor Q decreases. Therefore, the dielectric loss tends to increase, and also, the effect of enhancing the transverse rupture strength tends to decrease. Furthermore, if the content of the zinc oxide is greater than 20 parts by mass, the quality factor Q decreases, and the dielectric loss tends to increase. Thus, when the content of the zinc oxide is adjusted to be in the range described above, these tendencies can be suppressed.

In regard to the glass component, which is one of the additives, the content of the component as determined by calculating the mass of the glass component relative to $SiO_2$—$BaO$—$CaO$—$Li_2O$ glass, is preferably from 2.0 parts by mass to 10.0 parts by mass, and more preferably from 2.0 parts by mass to 7.0 parts by mass, relative to 100 parts by mass of a dielectric composition which has all the same additives but without the glass component.

If the content of the glass component is less than 2.0 parts by mass, the low temperature sintering effect is insufficient, and sintering occurs insufficiently. Also, the dielectric ceramic according to the present embodiment has a decreased sintered density and a decreased quality factor Q, the dielectric loss tends to increase, and also, the effect of enhancing the transverse rupture strength tends to decrease. Furthermore, if the content of the glass component is greater than 10.0 parts by mass, the quality factor Q decreases, and the dielectric loss tends increase. Thus, when the content of the glass component is adjusted to be in the range described above, these tendencies can be suppressed.

The dielectric ceramic according to the present embodiment may also contain, for example, a boron oxide, an alkaline earth metal oxide and the like, in addition to the zinc oxide and glass component as the components to be included as additives. Specific examples of the boron oxide include $B_2O_3$. Examples of the alkaline earth metal oxides include BaO, SrO, CaO and MgO.

The content of the boron oxide, as determined by calculating the mass of the boron oxide relative to $B_2O_3$, is preferably from 3.0 parts by mass to 10.0 parts by mass, and more preferably from 4.0 parts by mass to 8.0 parts by mass, relative to 100 parts by mass of the main component.

If the content of the boron oxide is less than 3.0 parts by mass, there is a tendency that the low temperature sintering effect is insufficient, and the quality factor Q decreases so that the dielectric loss tends to increase. Furthermore, if the content of the boron oxide is greater than 10.0 parts by mass, the sintered density of the dielectric ceramic is prone to decrease, and the quality factor decreases, so that the dielectric loss tends to increase, and the effect of enhancing the transverse rupture strength tends to decrease. Thus, when the content of the boron oxide is adjusted to be in the range described above, these tendencies can be suppressed.

The content of the alkaline earth metal oxide, as determined by calculating the mass of the alkaline earth metal oxide relative to RO (R represents an alkaline earth metal element), is preferably from 1.0 parts by mass to 4.0 parts by mass, and more preferably from 1.0 parts by mass to 3.0 parts by mass, relative to 100 parts by mass of the main component. When an alkaline earth metal oxide is incorporated into a dielectric ceramic composition, the dielectric ceramic composition exhibits a remarkable low temperature sintering effect.

If the content of the alkaline earth metal oxide is less than 1.0 parts by mass, there is a tendency that the low temperature sintering effect cannot be obtained sufficiently. Also, the sintered density of the dielectric ceramic according to the present embodiment is prone to decrease, and the quality factor Q decreases, so that the dielectric loss increases. Also, the effect of enhancing the transverse rupture strength tends to decrease. Furthermore, if the content of the alkaline earth metal oxide is greater than 4.0 parts by mass, the low temperature sintering effect becomes significant, but the quality factor Q decreases, so that the dielectric loss tends to increase. Thus, when the content of the alkaline earth metal oxide is adjusted to be in the range described above, these tendencies can be suppressed.

The alkaline earth metal, R, is preferably any one of barium (Ba), strontium (Sr) and calcium (Ca), and two or more kinds of these may be used in mixture. Specific examples of the alkaline earth metal oxide, RO, include MgO, CaO, SrO, and BaO.

In the dielectric ceramic according to the present embodiment, the peak intensity ratio, $I_B/I_A$, in x-ray diffraction is 10% or less, preferably 5% or less, and more preferably 0%. It is because, if the peak intensity ratio, $I_B/I_A$, is greater than 10%, the dielectric ceramic has insufficient sinterability, and sufficient strength may not be obtained.

In the X-ray diffraction analysis, the X-ray diffraction peak intensity $I_A$ of $Mg_2SiO_4$ as the main phase has the maximum peak when $2\theta$ is between 36.0° and 37.0°, and the X-ray diffraction peak intensity $I_B$ has the maximum peak when $2\theta$ is between 31.0° and 32.0°, and between 33.0° and 34.0°. From this X-ray diffraction peak intensity $I_B$, the presence of zinc oxide remaining unreacted can be confirmed, and when this X-ray diffraction peak intensity $I_B$ is compared with the X-ray diffraction peak intensity $I_A$ the proportion of zinc oxide remaining unreacted in the main component can be examined. The zinc oxide that remains unreacted in the main component affects sinterability of the dielectric ceramic when a dielectric ceramic composition is sintered, thereby decreasing the sintered density of the dielectric ceramic and lowering the Q factor. Therefore, when the peak intensity ratio, $I_B/I_A$, is adjusted to 10% or less, and the proportion of zinc oxide that remains unreacted in the main component is decreased, sinterability of the dielectric ceramic can be secured, the sintered density of the dielectric ceramic can be made satisfactory, and the Q factor can be increased.

The $2\theta$ angle of $Mg_2SiO_4$ for the X-ray diffraction peak intensity $I_A$ is defined to be in the range of between 36.0° and 37.0°. However, as will be described later, since zinc oxide or a glass component is added as an additive raw material powder to a crystal powder of $Mg_2SiO_4$ during the production of the dielectric ceramic composition, the $2\theta$ angle may slightly fluctuate in accordance with the composition ratios of the additives contained in the dielectric ceramic. Therefore, the $2\theta$ angle of $Mg_2SiO_4$ is preferably in the range of between 36.0° and 36.5°, and more preferably around 36.3°.

The $2\theta$ angle of the zinc oxide that remains unreacted for the X-ray diffraction peak intensity $I_B$ is defined to be in the range of between 31.0° and 32.0°, and between 33.0° and 34.0°. However, as discussed above, since the 2θ angle may slightly fluctuate in accordance with the composition ratios of the additives contained in, the dielectric ceramic, the angle between 31.0° and 32.0° for the 2θ angle of zinc oxide that remains unreacted is preferably in the range of between 31.5° and 32.0°, and more preferably around 31.5°. Furthermore, the angle between 33.0° and 34.0° for the 2θ angle of zinc oxide that remains unreacted is preferably in the range of between 33.3° and 33.8°, and more preferably around 33.6°.

The dielectric ceramic according to the present embodiment has a relative density of 96% or greater, and preferably 99% or greater. The relative density represents sinterability obtainable when a dielectric ceramic composition is fired. This is because, if the relative density is less than 96%, the dielectric ceramic has insufficient sinterability, and the dielectric ceramic exhibits a decrease in the Q factor and a decrease in strength. In the case where a dielectric ceramic composition is produced by using $Mg_2SiO_4$ as a main component, and using ZnO, $B_2O_3$, $CaCO_3$, and $SiO_2$—BaO—CaO—$Li_2O$ glass as additives, when the sintered density ρs is measured by varying the time and the firing temperature of a dielectric ceramic composition having an identical composition, the value of the sintered density ρs is 3.35 g/cm³. Although the value of the sintered density ρs of the dielectric ceramic slightly fluctuates depending on the composition ratios of the main component and the additives of the dielectric ceramic, the relative density can be determined by, for example, defining the relative density as 100% when the value of the sintered density ρs of the dielectric ceramic is 3.35 g/cm³. Accordingly, since sinterability of the dielectric ceramic can be secured by adjusting the relative density of the dielectric ceramic according to the present embodiment to be 96% or greater, the sintered density of the resulting dielectric ceramic can be made satisfactory, the Q factor can be increased, the dielectric loss can be decreased, and also, the transverse rupture strength can be increased.

A decrease in the Q factor means that the loss of an electronic component increases, and as the Q factor increases, the loss of an electronic component is suppressed to a low level. In the dielectric ceramic according to the present embodiment, the contents of the zinc oxide and the glass component are adjusted to be in the same ranges as those of the dielectric ceramic composition, the peak intensity ratio, $I_B/I_A$, in X-ray diffraction is adjusted to be 10% or less, and also the relative density is adjusted to 96% or greater. Thereby, for the dielectric ceramic according to the present embodiment, sinterability and the transverse rupture strength can be secured, and also, the dielectric loss can be made small by increasing the Q factor. For this reason, while low temperature sintering of the dielectric ceramic composition is attempted, the Q factor of the dielectric ceramic according to the present embodiment can be maintained to be equal to or greater than a predetermined value (for example, 1,000). Therefore, the dielectric ceramic according to the present embodiment can provide a dielectric ceramic capable of low temperature firing, which is used in electronic components that employ a low melting point conductor material such as an Ag-based metal as an internal electrode.

As such, the dielectric ceramic according to the present embodiment contains $Mg_2SiO_4$ as a main component and contains a zinc oxide and a glass component as additives. Also, the dielectric ceramic has the peak intensity ratio, $I_B/I_A$, in X-ray diffraction adjusted to 10% or less, and has a relative density of 96% or greater. The glass component contained as an additive in the dielectric ceramic according to the present embodiment plays the role as a liquid phase when the dielectric ceramic composition is fired, and can promote the reaction between $Mg_2SiO_4$ and the sintering aids that remain unreacted, so that even though the dielectric ceramic composition is fired at a low temperature, unreacted sintering aids can be eliminated, and the sintering aids can be made to undergo complete reaction, to thereby secure sinterability of the dielectric ceramic. In this case, the peak intensity ratio, $I_B/I_A$, of the dielectric ceramic according to the present embodiment is 10% or less, and also, the relative density is 96% or greater. Thereby, the Q factor of the dielectric ceramic thus obtainable can be increased, and the dielectric loss can be made small. Furthermore, when the composition described above is used, the dielectric ceramic composition can be co-fired with an Ag-based metal at a temperature as low to the extent that the Ag-based metal does not melt, and also, a decrease in the transverse rupture strength, which occurs concomitantly with a decrease in the firing temperature of the dielectric ceramic composition, can be suppressed. For this reason, the transverse rupture strength of the dielectric ceramic that is obtained by firing at a low temperature can be enhanced as compared with those dielectric ceramics that are obtained by firing conventional forsterite-based compositions. Accordingly, the dielectric ceramic according to the present embodiment can be obtained by firing at a low temperature, but still can have the sinterability of the dielectric ceramic secured, maintain the transverse rupture strength, and also have a decreased dielectric loss.

Method for Producing Dielectric Ceramic

An example of the method for producing a dielectric ceramic according to the present embodiment will be described. FIG. 1 is a flow chart showing a method for producing a dielectric ceramic according to the present embodiment. As shown in FIG. 1, the method for producing a dielectric ceramic according to the present embodiment includes the following steps, with regard to the production of a dielectric ceramic containing a main component which includes $Mg_2SiO_4$ and additives which include ZnO and a glass component.

(a) A $Mg_2SiO_4$ crystal powder production process of mixing a raw material powder of magnesium oxide and a raw material powder of silicon dioxide, heat treating the mixture, and thereby producing an $Mg_2SiO_4$ crystal powder (Step S11);

(b) A dielectric ceramic composition production process of adding a zinc oxide and a glass component described above as accessory raw material powders to the $Mg_2SiO_4$ crystal powder, and thereby obtaining a dielectric ceramic composition (Step S12); and (c) A firing process of firing the dielectric ceramic composition at a temperature of from 800° C. to 1,000° C. in an oxygen atmosphere, and thereby obtaining a sintered body (Step S13).

$Mg_2SiO_4$ crystal powder production process: Step S11

The $Mg_2SiO_4$ crystal powder production process (Step S11) is a process of mixing a raw material for magnesium oxide (Mg) and a raw material for silicon oxide ($SiO_2$), calcining the mixture, and thereby producing a forsterite ($Mg_2SiO_4$) crystal powder. A raw material powder of MgO and a raw material powder of $SiO_2$, which constitute the raw material for the $Mg_2SiO_4$ crystal powder, are respectively weighed in their predetermined amounts, and then the raw material powders are mixed. Thereby, a raw material mixed powder is obtained. Here, weighing of the respective raw materials of the additives is carried out such that the respective contents of the additives in the dielectric ceramic composition after completion, match the desired proportions (parts by mass) relative to the total amount of the dielectric ceramic composition. Furthermore, mixing of the raw material powder of MgO and the raw material powder of $SiO_2$ can be carried out by a mixing method such as dry mixing or wet mixing, and for example, the raw material powders are mixed with a mixing dispersing machine such as a ball mill, using a solvent such as pure water or ethanol. In the case of mixing with a ball mill, the mixing time is set to about 4 hours to 24 hours.

The mixed raw material powder is dried at a temperature of preferably from 100° C. to 200° C., and more preferably from 120° C. to 140° C., for about 12 hours to 36 hours, and then is heat treated (calcining). Through this calcining, $Mg_2SiO_4$ crystals are obtained. The firing temperature is preferably from 1,100° C. to 1,500° C., and more preferably from 1,100° C. to 1,350° C. Furthermore, the firing time is preferably about from 1 hour to 24 hours.

The synthesized $Mg_2SiO_4$ crystals are pulverized into a powder, and then the powder is dried. Thereby, an $Mg_2SiO_4$ crystal powder is obtained. This $Mg_2SiO_4$ crystal powder is used as a main component powder of the dielectric ceramic. The pulverizing process can be carried out by a pulverization method such as dry pulverization or wet pulverization, and for example, wet pulverization is carried out with a ball mill, using a solvent such as pure water or ethanol. The pulverization time is not particularly limited, and may be any time period capable of obtaining en $Mg_2SiO_4$ crystal powder having a desired average particle size. The pulverization time may be, for example, about from 4 hours to 24 hours. Drying of the $Mg_2SiO_4$ crystal powder is carried out at a drying temperature of preferably from 100° C. to 200° C., and more preferably from 120° C. to 140° C., for about 12 hours to 36 hours.

Furthermore, in order to enhance the effects based on the $Mg_2SiO_4$ crystals, it is necessary to reduce any unreacted raw material components such as MgO and $SiO_2$ contained in $Mg_2SiO_4$. Therefore, it is preferable that when a mixed raw material powder is produced by mixing MgO and $SiO_2$, MgO and $SiO_2$ be mixed such that the mole number of magnesium is twice the mole number of silicon.

It is not intended to limit the $Mg_2SiO_4$ crystal powder to a product obtained by a method of synthesizing $Mg_2SiO_4$ crystals from a raw material powder of MgO and a raw material powder of $SiO_2$, and any commercially available $Mg_2SiO_4$ may also be used. In this case, a commercially available $Mg_2SiO_4$ product may be pulverized and dried by the same method as described above to obtain an $Mg_2SiO_4$ crystal powder.

After the $Mg_2SiO_4$ crystal powder is obtained, the process moves to the dielectric ceramic composition production process (Step S12).

Dielectric ceramic composition production process:
Step S12

The dielectric ceramic composition production process (step S12) is a process of producing a dielectric ceramic composition by adding the zinc oxide and glass component described above as additive raw material powders to the $Mg_2SiO_4$ crystal powder, and thereby obtaining the dielectric ceramic composition.

The $Mg_2SiO_4$ crystal powder thus obtained and a zinc oxide as an additive raw material for the dielectric ceramic composition are weighed in predetermined amounts, and then these powders are mixed and heat treated. A glass component is added to the powder obtained after a heat treatment of the $Mg_2SiO_4$ crystal powder and an additive raw material powder, and the resulting mixture is pulverization treated to obtain a dielectric ceramic composition. According to the present embodiment, it is recommended to add the glass component to the powder obtained by mixing an $Mg_2SiO_4$ crystal powder and a zinc oxide and then heat treating the resulting mixture; however, the present embodiment is not intended to be limited to this, and the glass component may be incorporated at the time of mixing the $Mg_2SiO_4$ crystal powder and the zinc oxide and heat treating the mixture. Examples of the zinc oxide include ZnO, as described above. It is preferable that the glass component contain at least one or more kinds of glass containing $Li_2O$, as described above. The glass component is preferably constituted to include, for example, any one or both of $SiO_2$—RO—$Li_2O$ glass and $B_2O_3$—RO—$Li_2O$ glass. When the glass component contains $Li_2O$, the reaction between $Mg_2SiO_4$ and sintering aids that remain unreacted can be further promoted. Accordingly, sinterability of the dielectric ceramic composition can be mare stably secured, the Q factor of the dielectric ceramic thus obtainable can be further increased, and the dielectric loss can be made smaller. Furthermore, while the dielectric ceramic composition can be co-fired with an Ag-based metal at a temperature as low to the extent that the Ag-based metal does not melt, the transverse rupture strength of the dielectric ceramic can be more stably secured.

As the raw material of additive, a compound which turns into a zinc oxide or a glass containing $Li_2O$ when fired in a heat treatment such as calcining that will be described later, can also be used. As a raw material of the additive for the dielectric ceramic composition, for example, a boron oxide, an alkaline earth metal oxide, or compounds which turn into these oxides when fired (heat treatment such as calcining that will be described later), can be used in addition to the zinc oxide and the glass component. Examples of the boron oxide include $B_2O_3$. Examples of the alkaline earth metal oxide include BaO, srO, CaO, and MgO. Examples of the compounds which turn into the above-mentioned oxides by firing include carbonates, nitrates, oxalates, hydroxides, sulfides, and organometallic compounds. Examples of the boron oxide include $B_2O_3$. Examples of the alkaline earth metal oxide include EaO, SrO, CaO, and MgO.

Weighing of the respective raw materials of the zinc oxide and the glass component is carried out such that the respective contents of the zinc oxide and the glass component in the dielectric ceramic after completion, match the desired mass proportions (parts by mass) relative to the main component. That is, the content of the zinc oxide, as determined by calculating the mass of the zinc oxide relative to ZnO, is preferably from 8.0 parts by mass to 20 parts by mass, and more preferably from 12.0 parts by mass to 16.0 parts by mass, relative to 100 parts by mass of the main component. The content of the glass component, as determined by calculating the mass of the glass component relative to $SiO_2$—BaO—CaO—$Li_2O$ glass, is preferably from 2.0 parts by mass to 10.0 parts by mass, and more preferably from 2.0 parts by mass to 7.0 parts by mass, relative to 100 parts by mass of a dielectric composition which has all the same additives but without the glass component.

In the case where the dielectric ceramic composition contains, for example, a boron oxide, an alkaline earth metal oxide and the like as components that are included in the additives, in addition to the zinc oxide and the glass component, weighing of the components is also carried out such that the respective contents of the boron oxide and the alkaline earth metal oxide match the desired mass proportions (parts by mass) relative to the main component, as described above.

Mixing can be carried out by a mixing method such as dry mixing or wet mixing, and for example, mixing can be carried out by a mixing method using a solvent such as pure water or ethanol, with a mixing dispersing machine such as a ball mill. The mixing time may be set to about from 4 hours to 24 hours.

The mixed raw material powder is dried at a drying temperature of preferably from 100° C. to 200° C., and more preferably from 120° C. to 140° C., for about 12 hours to 36 hours.

The dried mixed raw material powder is heat treated (calcining), for example, at a temperature of from 800° C. to 950° C., for about 1 hour to 10 hours. When calcining is carried out as such at a temperature equal to or lower than the firing temperature, fusion of forsterite in the mixed raw material powder can be suppressed, and thereby, $Mg_2SiO_4$ can be incorporated in the form of crystals into the dielectric ceramic composition.

A Li-based glass such as a glass containing $Li_2O$ is added to the mixed raw material powder obtained after calcining, and the mixture is mixed, pulverized, and then dried. Thereby, a dielectric ceramic composition is obtained. Pulverization can be carried out by a pulverization method such as dry pulverization or wet pulverization. The pulverization time may be about from 4 hours to 24 hours. Drying of the mixed raw material powder obtained after pulverization may be carried out at a treatment temperature of preferably from 100° C. to 200° C., and more preferably from 120° C. to 140° C., for about 12 hours to 36 hours.

By the above-described method for producing a mixed raw material powder, which is a dielectric powder, the main component and the additives of the dielectric ceramic composition are uniformly mixed, and thus a dielectric ceramic composition with a uniform quality of material can be obtained.

After the dielectric ceramic composition is obtained, the process moves to the firing process of firing the dielectric ceramic composition (Step S13).

Firing process: Step S13

In the firing process (Step S13), the dielectric ceramic composition thus obtained is fired, and thus a sintered body is obtained. Thereby, the dielectric ceramic according to the present embodiment is obtained. Firing is preferably carried out, for example, in an oxygen atmosphere such as in air. Furthermore, the firing temperature is preferably equal to or lower than the melting point of the Ag-based metal that is used as a conductor material, and for example, the firing temperature is preferably from 800° C. to 1,000° C. more preferably from 800° C. to 950° C., even more preferably from 860° C. to 950° C., and most preferably from 880° C. to 940° C.

The dielectric ceramic obtainable by using the method for producing a dielectric ceramic according to the present embodiment as such has a peak intensity ratio, $I_B/I_A$, of 10% or less and a relative density of 96% or greater. For this reason, although firing is carried out at a low temperature of from 800° C. to 1,000° C. in the firing process (Step 313), the relative density of the dielectric ceramic is increased, and the content of ZnO that remains unreacted is reduced. Accordingly, the dielectric ceramic according to the present embodiment provides a dielectric ceramic which can be obtained by firing at a low temperature the firing process (Step S13), has the sinterability of the dielectric ceramic secured, maintains the transverse rupture strength, and also has excellent dielectric loss properties. Therefore, the dielectric ceramic according to the present embodiment can be suitably used as a dielectric ceramic that constitutes a part of an electronic component such as a filter, a resonator, a capacitor, or a circuit board.

Thus, a suitable embodiment of the dielectric ceramic according to the present invention has been described, but the present invention is not intended to be limited to the embodiment described above. For example, the dielectric ceramic according to the present invention may contain other compounds to the extent that the effects of securing sinterability, maintaining the transverse rupture strength, and decreasing the dielectric loss, while enabling firing of the dielectric ceramic at a low temperature, are not impaired.

Electronic Component

The dielectric ceramic according to the present embodiment can be suitably used, for example, as a dielectric layer constituting a part of an electronic component such as a filter, a capacitor, a resonator or a circuit board. FIG. 2 is a conceptual cross-sectional view schematically showing an embodiment of using an LC filter as the electronic component according to the first embodiment of the present invention. As shown in FIG. 2, an LC filter 10 includes plural dielectric layers 11, a coil 12, capacitor pattern sections 13-1 to 13-3, and a via (via conductor) 14. The dielectric layers 11 use the dielectric ceramic according to the present embodiment, The coil 12 and the capacitor pattern sections 13-1 to 13-3 are respectively formed of an Ag conductor. The via 14 is a via-hole section filled with an Ag conductor that passes through the coil 12 and the capacitor pattern section 13-1, and an LC resonant circuit is formed. The capacitor pattern section 13-1 is connected to the coil 12 through the via 14. The capacitor unit of the LC filter 10 has a three-layered structure, but the LC filter 10 is not limited to a three-layered structure and can be constructed into any multilayer structure. In the LC filter 10, since the dielectric ceramic according to the present embodiment is used in the dielectric layers 11, the transverse rupture strength is secured, and at the same time, a decrease in the dielectric loss is suppressed in the dielectric layers 11. Therefore, the LC filter 10 can maintain the strength of the dielectric layers 11, has a high Q factor, and also has a decreased dielectric loss. Therefore, properties appropriate for the use in high-frequency bands are obtained. Accordingly, the electronic component according to the present embodiment can be suitably used as an LC filter.

The LC filter 10 produced as described above is packaged on a printed board by soldering or the like, and is used as such in a variety of electronic equipment.

The electronic component according to the present embodiment is not intended to be limited to an electronic component in which dielectric layers 11 and capacitor pattern sections 13-1 to 13-3 are alternately laminated, as in the case of the LC filter 10 shown in FIG. 2, and any electronic component which includes a dielectric layer can be suitably used. Furthermore, the dielectric ceramic according to the present embodiment can also be suitably used as an electronic component in which elements are further individually packaged in the outside. As for other electronic components of the present embodiment, for example, a capacitor, a resonator, a circuit board, a low-pass filter (LPF), a band-pass filter (BPF), a diplexer (DPX), a coupler (directional connector), and a balun (balanced-unbalanced impedance converter) can also be suitably used Method for Producing Electronic Component An example of the method for producing an electronic component according to the present embodiment will be described. FIG. 3 is a flow chart showing an example of the method for producing an electronic component according to the present embodiment. As shown in FIG. 3, the method for producing an electronic component according to the present embodiment involves forming the dielectric ceramic composition produced by the method for producing a dielectric ceramic as shown in FIG. 1, laminating a plural number of the molded bodies, and firing the laminated body. With regard to the production of the electronic component according to the present embodiment, the production method includes the following processes.

(a) A $Mg_2SiO_4$ crystal powder production process of mixing magnesium oxide and silicon dioxide, heat treating the mixture, and thereby producing an $Mg_2SiO_4$ crystal powder (Step S21);

(b) A dielectric ceramic composition production process of adding a zinc oxide and a glass component as additive raw material powders to the $Mg_2SiO_4$ crystal powder, and thereby obtaining a dielectric ceramic composition (Step S22);

(c) A molded body production process of applying a paste containing a powder of the dielectric ceramic composition on a substrate, and thereby producing a molded body (Step S23);

(d) A laminated body production process of laminating a plural number of green sheets that are obtained by forming the molded body, and thereby obtaining a laminated body (Step S24); and (e) A firing process of firing the laminated body at a temperature of from 800° C. to 1,000° C. in an oxygen atmosphere, and thereby obtaining a sintered body (Step S25).

$Mg_2SiO_4$ crystal powder production process (Step S21) and dielectric ceramic composition production process (Step S22)

The $Mg_2SiO_4$ crystal powder production process (Step S21) and the dielectric ceramic composition production process (Step S22) are carried out in the same manner as in the $Mg_2SiO_4$ crystal powder production process (Step S11) and the dielectric ceramic composition production process (Step S12) shown in FIG. 1, which are carried out in the production of the dielectric ceramic as described above. Therefore, further explanation will not be repeated. After the dielectric ceramic composition is obtained, the process naves to the molded body production process of producing a molded body (Step S23).

Molded product production process: Step S23

The molded body production process (Step S23) is a process of applying a paste containing a powder of the dielectric ceramic composition on a substrate, and thereby producing a molded body. The powder of the dielectric ceramic composition thus obtained is added to an organic binder such as a polyvinyl alcohol-based binder, an acrylic binder, or an ethylcellulose-based binder, and then the resulting mixture is molded into a sheet form to thereby obtain a green sheet. Examples of the method for forming a green sheet include wet molding methods such as a sheet method or a printing method. After a molded body is produced, the process moves to the laminated body production process of producing a laminated body (Step S24).

Laminated body production process: Step S24

The laminated body production process (Step S24) is a process of laminating a plural number of green sheets that are obtained by forming the molded body, and thereby obtaining a laminated body. In the laminated body production process (Step S24), an electrically conductive paste containing Ag is applied on the green sheet obtained by farming, such that an internal electrode having a predetermined shape is formed. The green sheet having the conductive paste applied thereon is produced in a plural number as necessary, and the green sheets are laminated, and pressed. Thereby, a laminated body is obtained. The laminated body thus obtained is cut to a desired size, and is chamfered. Subsequently, the process moves to the firing process of firing a chip (Step S25).

Firing process: Step S25

The firing process (Step S25) is carried out in the same manner as in the firing process (Step S13) shown in FIG. 1, which is carried out in the production of the dielectric ceramic as described above, and therefore, further explanation will not be repeated. After the sintered body is cooled, if necessary, an external electrode and the like are formed on the dielectric ceramic thus obtained, and thereby an electronic component having an external electrode and the like formed on the dielectric ceramic is completed.

Second Embodiment

Dielectric Ceramic

The dielectric ceramic according to a second embodiment of the present invention contains a main component which includes $Mg_2SiO_4$, and additives which include a zinc oxide, a glass component, and any one or both of an aluminum oxide and a titanium oxide.

Main Component

The dielectric ceramic according to the present embodiment contains $Mg_2SiO_4$ (forsterite) as a main component. The $Mg_2SiO_4$ contained as a main component in this embodiment is the same as the $Mg_2SiO_4$ that is contained as a main component in the dielectric ceramic according to the first embodiment, and therefore, further explanation will not be repeated.

Additives

The dielectric ceramic according to the present embodiment is constituted to have a composition containing a zinc oxide, a glass component, and any one or both of an aluminum oxide and a titanium oxide as additives with respect to $Mg_2SiO_4$ as the main component. The additives are used as sintering aids that form a liquid phase when the dielectric ceramic composition is fired, Particularly, the glass component incorporated as an additive plays the role as a liquid phase, and promotes the reactivity between $Mg_2SiO_4$ as the main component and the sintering aids that remain unreacted. Thereby, the amount of sintering aids that remain unreacted in the dielectric ceramic after firing of the dielectric ceramic composition can be reduced, and also, the sintering aids can be made to undergo complete reaction. Therefore, sinterability of the dielectric ceramic is secured. As a result, the Q factor of the resulting dielectric ceramic can be increased, and the dielectric loss can be made small. Furthermore, since the aluminum oxide and the titanium oxide respectively have high Q factors, sinterability of the dielectric ceramic is secured. Therefore, the Q factor of the dielectric ceramic can be increased, and the dielectric loss can be made small.

Furthermore, when a zinc oxide, a glass component, and any one or both of an aluminum oxide and a titanium oxide are added to a dielectric ceramic composition as sintering aids that form a liquid phase at the time of firing, and are incorporated into the dielectric ceramic composition as additives, the sintering temperature of the dielectric ceramic composition is decreased. For this reason, when a dielectric ceramic is produced by firing a dielectric ceramic composition, the dielectric ceramic composition can be co-fired with an Ag-based metal at a low temperature (a temperature lower than the melting point of the Ag-based metal), and low temperature firing can be attempted. Also, a decrease in the transverse rupture strength of the dielectric ceramic, which occurs concomitantly with a decrease in the firing temperature of the dielectric ceramic composition, can be suppressed.

Examples of the zinc oxide include ZnO. Examples of the aluminum oxide include $Al_2O_3$. Examples of the titanium oxide include $TiO_2$. The glass component preferably contains at least one or more kinds of glass containing $Li_2O$. When the glass component contains $Li_2O$, the glass component can further promote the reactivity between $Mg_2SiO_4$ and unreacted sintering aids, and therefore, sinterability of the dielectric ceramic can be more stably secured. Thereby, the Q factor of the resulting dielectric ceramic can be further increased, and the dielectric loss can be further decreased. Also, the dielectric ceramic composition can be co-fired with an Ag-based metal at a low temperature (a temperature lower than the melting point of the Ag-based metal), and still, the transverse rupture strength of the dielectric ceramic can be more stably secured.

Such a glass component is preferably constituted to include, for example, any one or two or more of $SiO_2$—RO—$Li_2O$ (wherein RO contains one or more kinds of alkaline earth metal oxide) glass, $B_2O_3$—RO—$Li_2O$ glass, and $SiO_2$—RO—$Li_2O$—$Al_2O_3$ glass, as in the case of the glass component that is contained as an additive in the dielectric ceramic according to the first embodiment. Examples of the $SiO_2$—RO—Li2O glass include $SiO_2$—CaO—$Li_2O$ glass, $SiO_2$—SrO—$Li_2O$ glass, $SiO_2$—BaO—$Li_2O$ glass, $SiO_2$—CaO—SrO—$Li_2O$ glass, $SiO_2$—BaO—CaO—$Li_2O$ glass, $SiO_2$—SrO—BaO—$Li_2O$ glass, and $SiO_2$—CaO—SrO—BaO—$Li_2O$ glass. Examples of the B2O3-RO—Li2O glass include B2O3-CaO—Li2O glass, B2O3-SrO—Li2O glass, B2O3-BaO—Li2O glass, B2O3-CaO—SrO—Li2O glass, B2O3-BaO—CaO—Li2O glass, B2O3-SrO—BaO—Li2O glass, and B2O3-CaO—SrO—Li2O glass. Examples of the $SiO_2$—RO—$Li_2O$—$Al_2O_3$ glass include $SiO_2$—CaO—$Li_2O$—$Al_2O_3$ glass, $SiO_2$—SrO—$Li_2O$—$Al_2O_3$ glass, $SiO_2$—BaO—$Li_2O$—$Al_2O_3$ glass, $SiO_2$—CaO—SrO—$Li_2O$—$Al_2O_3$ glass, $SiO_2$—BaO—CaO—$Li_2O$—$Al_2O_3$ glass, $SiO_2$—SrO—BaO—$Li_2O$—$Al_2O_3$ glass, and $SiO_2$—CaO—SrO—BaO—$Li_2O$—$Al_2O_2$. Among these, $SiO_2$—BaO—CaO—$Li_2O$ glass is preferred.

Therefore, the dielectric ceramic according to the present embodiment can be obtained by firing at a low temperature, but still can have the sinterability secured and have excellent dielectric properties. Furthermore, when the dielectric ceramic composition is co-fired with an Ag-based metal at a temperature as low to the extent that the Ag-based metal does not melt, a decrease in the transverse rupture strength of the dielectric ceramic, which occurs concomitantly with a decrease in the firing temperature of the dielectric ceramic composition, can be suppressed. For this reason, the transverse rupture strength of the dielectric ceramic that is obtained by firing at a low temperature can be enhanced as compared with that of those dielectric ceramics that are obtained by firing conventional forsterite-based compositions.

The content of the zinc oxide, as determined by calculating the mass of the zinc oxide relative to ZnO, is preferably from 8.0 parts by mass to 20 parts by mass, more preferably from 10 parts by mass to 16 parts by mass, and even more preferably from 12.0 parts by mass to 16.0 parts by mass, relative to 100 parts by mass of the main component, as in the case of the zinc oxide contained as an additive in the dielectric ceramic according to the first embodiment. When the dielectric ceramic composition is co-fired with an Ag-based metal, the zinc oxide (particularly, ZnO) contributes to the feasibility of firing at a low temperature (a temperature lower than the melting point of the Ag-based metal). For this reason, when the content of the zinc oxide is adjusted to be in the range described above, the dielectric ceramic composition can be stably co-fired with an Ag-based metal at a low temperature (a temperature lower than the melting point of the Ag-based metal).

If the content of the zinc oxide is less than 8.0 parts by mass, there is a tendency that the low temperature sintering effect (that is, the effect of enabling the sintering of a dielectric ceramic composition at a lower temperature) may be insufficient, so that the sintered density of the dielectric ceramic according to the present embodiment is decreased, and the quality factor Q decreases. Therefore, the dielectric loss tends to increase, and also, the effect of enhancing the transverse rupture strength tends to decrease. Furthermore, if the content of the zinc oxide is greater than 20 parts by mass, the quality factor Q decreases, and the dielectric loss tends to increase. Thus, when the content of the zinc oxide is adjusted to be in the range described above, these tendencies can be suppressed.

In regard to the glass component, which is one of the additives, the content of the component as determined by calculating the mass of the glass component relative to $SiO_2$—BaO—CaO—$Li_2O$ glass, is preferably from 2.0 parts by mass to 10.0 parts by mass, and more preferably from 2.0 parts by mass to 7.0 parts by mass, relative to 100 parts by mass of a dielectric composition which has all the same additives but without the glass component, as in the case of the glass component that is contained as an additive in the dielectric ceramic according to the first embodiment, If the content of the glass component is less than 2.0 parts by mass, the low temperature sintering effect is insufficient, and sintering occurs insufficiently. Also, the dielectric ceramic according to the present embodiment has a decreased sintered density and a decreased quality factor Q, the dielectric loss tends to increase, while the effect of enhancing the transverse rupture strength tends to decrease. Furthermore, if the content of the glass component is greater than 10.0 parts by mass, the quality factor Q decreases, and the dielectric loss tends to increase. Thus, when the content of the glass component is adjusted to be in the range described above, these tendencies can be suppressed.

The content of the aluminum oxide, as determined by calculating the mass of the aluminum oxide relative to $Al_2O_3$, is preferably from 0.1 parts by mass to 10.0 parts by mass, and more preferably from 0.5 parts by mass to 5.0 parts by mass, relative to 100 parts by mass of the main component.

If the content of the aluminum oxide is less than 0.1 parts by mass, the sintered density and the quality factor Q of the dielectric ceramic according to the present embodiment tend to decrease, and the dielectric loss tends to increase. Also, the effect of enhancing the transverse rupture strength tends to decrease. Furthermore, if the content of the aluminum oxide is greater than 10.0 parts by mass, the low temperature sintering effect is insufficient, and sintering occurs insufficiently. Also, the quality factor Q tends to decrease, while the dielectric loss tends to increase. Thus, when the content of the aluminum oxide is adjusted to be in the range described above, these tendencies can be suppressed.

The content of the titanium oxide, as determined by calculating the mass of the titanium oxide relative to $TiO_2$, is preferably from 0.1 parts by mass to 10.0 parts by mass, and more preferably from 0.5 parts by mass to 5.0 parts by mass, relative to 100 parts by mass of the main component.

If the content of the titanium oxide is less than 0.1 parts by mass, the sintered density and the quality fact or Q of the dielectric ceramic according to the present embodiment tend to decrease, and the dielectric loss tends to increase. Also, the effect of enhancing the transverse rupture strength tends to decrease. Furthermore, if the content of the titanium oxide is greater than 10.0 parts by mass, the low temperature sintering effect is insufficient, and sintering occurs insufficiently. Also, the quality factor Q tends to decrease, while the dielectric loss tends to increase. Thus, when the content of the titanium oxide is adjusted to be in the range described above, these tendencies can be suppressed.

The dielectric ceramic according to the present embodiment may also contain, for example, a boron oxide, an alkaline earth metal oxide and the like, in addition to the zinc oxide, glass component, and any one or both of aluminum oxide and titanium oxide as the components to be included as additives. Specific examples of the boron oxide include $B_2O_3$. Examples of the alkaline earth metal oxides include BaO, SrO, CaQ and MgO.

The content of the boron oxide, as determined by calculating the mass of the boron oxide relative to $B_2O_3$, is preferably from 3.0 parts by mass to 10.0 parts by mass, and more preferably from 4.0 parts by mass to 8.0 parts by mass, relative to 100 parts by mass of the main component, as in the case of the boron oxide that is contained as an additive in the dielectric ceramic according to the first embodiment.

If the content of the boron oxide is less than 3.0 parts by mass, there is a tendency that the low temperature sintering effect is insufficient, and the quality factor Q decreases so that the dielectric loss tends to increase. Furthermore, if the content of the boron oxide is greater than 10.0 parts by mass, the sintered density of the dielectric ceramic is prone to decrease, and the quality factor decreases, so that the dielectric loss tends to increase, and the effect of enhancing the transverse rupture strength tends to decrease. Thus, when the content of the boron oxide is adjusted to be in the range described above, these tendencies can be suppressed.

The content of the alkaline earth metal oxide, as determined by calculating the mass of the alkaline earth metal oxide relative to RO (R represents an alkaline earth metal element), is preferably from 1.0 parts by mass to 4.0 parts by mass, and more preferably from 2.0 parts by mass to 3.0 parts by mass, relative to 100 parts by mass of the main component, as in the case of the alkaline earth metal oxide that is contained as an additive in the dielectric ceramic according to the first embodiment. When an alkaline earth metal oxide is incorporated into a dielectric ceramic composition, the dielectric ceramic composition exhibits a remarkable low temperature sintering effect.

If the content of the alkaline earth metal oxide is less than 1.0 parts by mass, there is a tendency that the low temperature sintering effect cannot be obtained sufficiently. Also, the sintered density of the dielectric ceramic according to the present embodiment is prone to decrease, and the quality factor Q decreases so that the dielectric loss increases. Also, the effect of enhancing the transverse rupture strength tends to decrease. Furthermore, if the content of the alkaline earth metal oxide is greater than 4.0 parts by mass, the low temperature sintering effect becomes significant, but the quality factor Q decreases, so that the dielectric loss tends to increase. Thus, when the content of the alkaline earth metal oxide is adjusted to be in the range described above, these tendencies can be suppressed.

The alkaline earth metal, R, is preferably any one of Ba, Sr and Ca, and two or more kinds of these may be used in mixture. Specific examples of the alkaline earth metal oxide, RO, include MgO, CaO, SrO, and BaO.

As such, the dielectric ceramic according to the present embodiment contains $Mg_2SiO_4$ as a main component, contains a zinc oxide and a glass component as additives, and also contains any one or both of an aluminum oxide and a titanium oxide. The glass component contained as an additive in the dielectric ceramic according to the present embodiment plays the role as a liquid phase when the dielectric ceramic composition is fired, and can promote the reactivity between $Mg_2SiO_4$ and the sintering aids that remain unreacted. Therefore, even though the dielectric ceramic composition is fixed at a low temperature, unreacted sintering aids can be eliminated, the sintering aids can be made to undergo complete reaction, and thus sinterability of the dielectric ceramic can be secured. Thereby, the Q factor of the dielectric ceramic can be increased, and the dielectric loss can be made small. Furthermore, since the aluminum oxide and the titanium oxide respectively have high Q factors, sinterability of the dielectric ceramic is secured, so that the Q factor of the dielectric ceramic thus obtainable can be increased, and the dielectric loss can be made small. When dielectric ceramic composition having the composition described above is used, the dielectric ceramic composition can be co-fired with an Ag-based metal at a temperature as low to the extent that the Ag-based metal does not melt. Also, when the dielectric ceramic composition is co-fired with an Ag-based metal at a temperature as low to the extent that the Ag-based metal does not melt, a decrease in the transverse rupture strength, which occurs concomitantly with a decrease in the firing temperature of the dielectric ceramic composition, can be suppressed. Accordingly, the dielectric ceramic according to the present embodiment can be obtained by firing at a low temperature, but still can have the sinterability secured, and can also have a decreased dielectric loss, A decrease in the Q factor means that the loss of an electronic component increases, and as the Q factor increases, the loss of an electronic component is suppressed to a low level. When the respective contents of the zinc oxide, glass component, and any one or both of aluminum oxide and titanium oxide, which are contained as additives, are adjusted to be in the ranges described above, low temperature sintering of the dielectric ceramic composition can be attempted, while the Q factor of the dielectric ceramic according to the present embodiment can be maintained to be equal to or greater than a predetermined value (for example, 1,000). Thereby, the dielectric ceramic according to the present embodiment can provide a dielectric ceramic capable of low temperature firing, which is used in electronic components having a low melting point conductor material such as an Ag-based metal, as en internal electrode.

Method for Producing Dielectric Ceramic

An example of the method for producing a dielectric ceramic according to the present embodiment will be described. FIG. 4 is a flow chart showing the method for producing a dielectric ceramic according to the present embodiment. As shown in FIG. 4, the method for producing a dielectric ceramic according to the present embodiment includes the following processes, with regard to the production of a dielectric ceramic containing a main component which includes $Mg_2SiO_4$ and additives which include ZnO, a glass component and an aluminum oxide.

(a) A $Mg_2SiO_4$ crystal powder production process of mixing a raw material powder of magnesium oxide and a raw material powder of silicon dioxide, heat treating the mixture, and thereby producing an $Mg_2SiO_4$ crystal powder (Step S31);

(b) A dielectric ceramic composition production process of adding a zinc oxide, a glass component and an aluminum oxide as additive raw material powders to the $Mg_2SiO_4$ crystal powder, and thereby obtaining a dielectric ceramic composition (Step S32); and (c) A firing process of firing the dielectric ceramic composition at a temperature of from 800° C. to 1,000° C. in an oxygen atmosphere, and thereby obtaining a sintered body (Step S33).

In regard to the sintering aids, a case of using sintering aids which include an aluminum oxide in addition to a zinc oxide and a glass component will be described, but the present embodiment is not intended to this. The sintering aids may include a titanium oxide instead of an aluminum oxide, or may include both of an aluminum oxide and a titanium oxide.

Mg$_2$SiO$_4$ crystal powder production process: Step S31

The Mg$_2$SiO$_4$ crystal powder production process (Step S31) is carried out in the same manner as in the "Mg$_2$SiO$_4$ crystal powder production process (Step S11)" described in connection with the method for producing a dielectric ceramic according to the first embodiment, and therefore, further explanation will not be repeated.

Dielectric ceramic composition production process: Step S32

The dielectric ceramic composition production process (Step S32) is a process of mixing additive raw material powders including a zinc oxide and an aluminum oxide with the Mg$_2$SiO$_4$ crystal powder, heat treating the mixture, further adding a glass component as an additive raw material powder to the Mg$_2$SiO$_4$ crystal powder, and thereby obtaining a dielectric ceramic composition.

The Mg$_2$SiO$_4$ crystal powder thus obtained, and the zinc oxide and aluminum oxide which are the raw materials of the additives for the dielectric ceramic composition are weighed in the respective predetermined amounts, and then these components are mixed and heat treated. The glass component is added to the powder obtainable after the heat treatment, and the resulting mixture is pulverization treated to obtain a dielectric ceramic composition. According to the present embodiment, it is recommended to add the glass component to the powder obtained by mixing an Mg$_2$SiO$_4$ crystal powder, a zinc oxide and an aluminum oxide, and then heat treating the resulting mixture; however, the present embodiment is not intended to be limited to this, and the glass component may be incorporated at the time of mixing the Mg$_2$SiO$_4$ crystal powder, zinc oxide and aluminum oxide, and heat treating the mixture. Examples of the zinc oxide include ZnO, as in the case of the "dielectric ceramic composition production process (Step S12)" described in connection with the method for producing a dielectric ceramic according to the first embodiment. Examples of the aluminum oxide include Al$_2$O$_3$, as described above. It is preferable that the glass component contain at least one or more kinds of glass containing Li$_2$O, as in the case of the "dielectric ceramic composition production process (Step S12)" described in connection with the method for producing a dielectric ceramic according to the first embodiment. The glass component is preferably constituted to include, for example, any one or both of SiO$_2$—RO—Li$_2$O glass and B$_2$O$_3$—RO—Li$_2$O glass. When the glass component contains Li$_2$O, the reaction between Mg$_2$SiO$_4$ and unreacted sintering aids can be further promoted. Accordingly, sinterability of the dielectric ceramic composition can be more stably secured, the Q factor of the dielectric ceramic thus obtainable can be further increased, and the dielectric loss can be made smaller. Furthermore, while the dielectric ceramic composition can be co-fired with an Ag-based metal at a temperature as low to the extent that the Ag-based metal does not melt, the transverse rupture strength of the dielectric ceramic can be more stably secured.

As the raw material of additive, a compound which turns into a zinc oxide, an aluminum oxide or a glass containing Li$_2$O when fired in a heat treatment such as calcining that will be described later, can also be used as in the case of the "dielectric ceramic composition production process (Step S12)" described in connection with the method for producing a dielectric ceramic according to the first embodiment. As the raw material of additive for the dielectric ceramic composition, for example, a titanium oxide, a boron oxide, an alkaline earth metal oxide, or compounds which turn into these oxides when fired (heat treatment such as calcining that will be described later)/can be used in addition to the zinc oxide, aluminum oxide and glass component. Examples of the titanium oxide include TiO$_2$, Examples of the boron oxide include B$_2$O$_3$. Examples of the alkaline earth metal oxide include BaO, SrO, CaO, and MgO, Examples of the compounds which turn into the above-mentioned oxides by firing include carbonates, nitrates, oxalates, hydroxides, sulfides, and organometallic compounds.

Weighing of the respective raw materials of the zinc oxide, aluminum oxide and glass component is carried out such that the respective contents of the zinc oxide, aluminum oxide and glass component in the dielectric ceramic after completion, match the desired mass proportions (parts by mass) relative to the main component, as in the case of the "dielectric ceramic composition production process (Step S12)" described in connection with the method for producing a dielectric ceramic according to the first embodiment. That is, the content of the zinc oxide, as determined by calculating the mass of the zinc oxide relative to znO, is preferably from 8.0 parts by mass to 20 parts by mass, and more preferably from 12.0 parts by mass to 16.0 parts by mass, relative to 100 parts by mass of the main component. The content of the glass component, as determined by calculating the mass of the glass component relative to SiO$_2$—BaO—CaO—Li$_2$O glass, is preferably from 2.0 parts by mass to 10.0 parts by mass, and more preferably from 2.0 parts by mass to 7.0 parts by mass, relative to 100 parts by mass of a dielectric composition which has all the same additives but without the glass component. The content of the aluminum oxide, as determined by calculating the mass of the aluminum oxide relative to Al$_2$O$_3$, is preferably from 0.1 parts by mass to 10 parts by mass, and more preferably from 0.5 parts by mass to 5.0 parts by mass, relative to 100 parts by mass of the main component.

As in the case of the "dielectric ceramic composition production process (Step S12)" described in connection with the method for producing a dielectric ceramic according to the first embodiment, when the dielectric ceramic composition contains, for example, a titanium oxide, a boron oxide, an alkaline earth metal oxide and the like as components that are included in the additives in addition to the zinc oxide, aluminum oxide and glass component, weighing of the components is also carried out such that the respective contents of the titanium oxide, the boron oxide and the alkaline earth metal oxide match the desired mass proportions (parts by mass) relative to the main component, as described above.

Mixing can be carried out by a mixing method such as dry mixing or wet mixing, as in the case of the "dielectric ceramic composition production process (Step S12)" described in connection with the method for producing a dielectric ceramic according to the first embodiment, and can be carried out by, for example, a mixing method using a solvent such as pure water or ethanol with a mixing dispersing machine such as a ball mill. The mixing time may be set to about from 4 hours to 24 hours.

The mixing raw material powder is dried at a drying temperature of preferably from 100° C. to 200° C., and more preferably from 120° C. to 140° C., for about 12 hours to 36 hours, as in the case of the "dielectric ceramic composition production process (Step S12)" described in connection with the method for producing a dielectric ceramic according to the first embodiment.

The dried mixed raw material powder is heat treated (calcining) at a temperature lower than the firing temperature (from 800° C. to 1,000° C.) in the firing process that will be described below, for example, at a temperature of from 800° C. to 950° C., for about 1 hour to 10 hours, as in the case of the "dielectric ceramic composition production process (Step S12)" described in connection with the method for producing a dielectric ceramic according to the first embodiment. When calcining is carried out as such at a temperature equal to or lower than the firing temperature, fusion of forsterite in the mixed raw material powder can be suppressed, and thereby, $Mg_2SiO_4$ can be incorporated in the form of crystals into the dielectric ceramic composition.

A Li-based glass is added to the mixed raw material powder obtained after calcining, as in the case of the "dielectric ceramic composition production process (Step S12)" described in connection with the method for producing a dielectric ceramic according to the first embodiment. The mixture is mixed, pulverized, and then dried, and thereby, a dielectric ceramic composition is obtained. Pulverization can be carried out by a pulverization method such as dry pulverization or wet pulverization. The pulverization time may be about from 4 hours to 24 hours. Drying of the mixed raw material powder obtained after pulverization may be carried out at a treatment temperature of preferably from 100° C. to 200° C., and more preferably from 120° C. to 140° C., for about 12 hours to 36 hours.

By the above-described method for producing a mixed raw material powder, which is a dielectric powder, the main component and the additives of the dielectric ceramic composition are uniformly mixed, and thus a dielectric ceramic composition with a uniform quality of material can be obtained.

After the dielectric ceramic composition is obtained, the process moves to the firing process of firing the dielectric ceramic composition (Step S33).

Firing process: Step S33

In the firing process (Step S33), the dielectric ceramic composition thus obtained is fired, and thus a sintered body is obtained. Thereby, the dielectric ceramic according to the present embodiment is obtained. Since the firing process is carried out in the same manner as in the "firing process (Step S13)" described in connection with the method for producing the dielectric ceramic according to the first embodiment, further explanation will not be repeated.

As such, in regard to the dielectric ceramic obtained by using the method for producing a dielectric ceramic according to the present embodiment, even though the dielectric ceramic composition is fired at a low temperature of from 800° C. to 1,000° C. in the firing process (Step S33), the reaction between $Mg_2SiO_4$ and the sintering aids that remain unreacted can be promoted. Accordingly, sinterability can be secured while low temperature (a temperature lower than the melting points of Ag-based metals) firing is maintained, and therefore, the dielectric ceramic has a reduced content of sintering aids that remain unreacted. Thus, the dielectric ceramic according to the present embodiment provides a dielectric ceramic which can be obtained by firing at a low temperature (a temperature lower than the melting points of Ag-based metals) in the firing process (Step S33), can have the sinterability of the dielectric ceramic secured, and has excellent dielectric loss properties. Therefore, the dielectric loss according to the present embodiment can be suitably used as a dielectric ceramic which constitutes a part of an electronic component such as a filter, a resonator, a capacitor, or a circuit board.

Thus, a suitable embodiment of the dielectric ceramic according to the present invention has been described, but the present invention is not intended to be limited to the embodiment described above. For example, the dielectric ceramic according to the present invention may contain other compounds to the extent that the effects of securing sinterability and decreasing the dielectric loss even at a low firing temperature, while enabling firing of the dielectric ceramic at a low temperature, are not impaired.

Electronic Component

The dielectric ceramic according to the present embodiment can be suitably used, for example, as a dielectric layer constituting a part of an electronic component such as a filter, a capacitor, a resonator or a circuit board, as in the case described in connection with the dielectric ceramic according to the first embodiment. When the electronic component according to the present embodiment is used as an LC filter such as shown in FIG. 2, the LC filter 10 uses the dielectric ceramic according to the present embodiment in the dielectric layers 11, and the dielectric layers 11 suppress a decrease in the dielectric loss. Therefore, the LC filter 10 can maintain the mechanical strength of the dielectric layers 11, and also has a high Q factor and a reduced dielectric loss, and thus the LC filter 10 can acquire properties appropriate for the use in high-frequency bands. Therefore, the electronic component of the present embodiment can be suitably used as an LC filter.

Method for Producing Electronic Component

An example of the method for producing an electronic component according to the present embodiment will be described. FIG. 5 is a flow chart showing an example of the method for producing an electronic component according to the present embodiment. As shown in FIG. 5, the method for producing an electronic component according to the present embodiment involves forming the dielectric ceramic composition produced by the method for producing a dielectric ceramic as shown in FIG. 4, laminating a plural number of the molded bodies, and firing the laminated body. With regard to the production of the electronic component according to the present embodiment, the production method includes the following processes.

(a) An $Mg_2SiO_4$ crystal powder production process of mixing magnesium oxide and silicon dioxide, heat treating the mixture, and thereby producing an $Mg_2SiO_4$ crystal powder (Step S41);

(b) A dielectric ceramic composition production process of adding a zinc oxide, a glass component and an aluminum oxide as additive raw material powders to the $Mg_2SiO_4$ crystal powder, and thereby obtaining a dielectric ceramic composition (Step S42);

(c) A molded body production process of applying a paste containing a powder of the dielectric ceramic composition on a substrate, and thereby producing a molded body (Step S43);

(d) A laminated body production process of laminating a plural number of green sheets that are obtained by forming the molded body, and thereby obtaining a laminated body (Step S44); and (e) A firing process of firing the laminated body at a temperature of from 800° C. to 1,000° C. in an oxygen atmosphere, and thereby obtaining a sintered body (step S45).

In regard to the sintering aids, a case of using sintering aids which include an aluminum oxide in addition to a zinc oxide and a glass component will be described, but the present embodiment is not intended to this. As discussed above, the sintering aids may include a titanium oxide instead of an aluminum oxide, or may include both of an aluminum oxide and a titanium oxide.

$Mg_2SiO_4$ crystal powder production process (Step S41) and dielectric ceramic composition production process (Step S42)

The $Mg_2SiO_4$ crystal powder production process (Step S41) and the dielectric ceramic composition production process (Step S42) are carried out in the same manner as in the $Mg_2SiO_4$ crystal powder production process (Step S31) and the dielectric ceramic composition production process (Step S32) shown in FIG. 4, which are carried out in the production of the dielectric ceramic as described above. Therefore, further explanation will not be repeated. After the dielectric ceramic composition is obtained, the process moves to the molded body production process of producing a molded body (Step S43)

Molded product production process: Step S43

The molded body production process (Step S43) is carried out in the same manner as the "molded body production process (Step S23)" described in connection with the method for producing an electronic component according to the first embodiment, and therefore, further explanation will not be repeated. After the molded body is produced, the process moves to the laminated body production process of producing a laminated body (Step S44).

Laminated body production process: Step S44

The laminated body production process (Step S44) is carried out in the same manner as in the "laminated body production process (Step S23S24)" described in connection with the method for producing an electronic component according to the first embodiment, and therefore, further explanation will not be repeated. The laminated body thus obtained is cut to a desired size, and is chamfered. Subsequently, the process moves to the firing process of firing a chip (Step S45).

Firing process: Step S45

The firing process (Step S45) is carried out in the same manner as in the "firing process (Step S33)" shown in FIG. 4, which is carried out in the production of the dielectric ceramic as described above, and therefore, further explanation will not be repeated. After the sintered body is cooled, if necessary, an external electrode and the like are formed on the dielectric ceramic thus obtained, and thereby an electronic component having an external electrode and the like formed on the dielectric ceramic is completed.

EXAMPLES

Hereinafter, the present invention will be described in more detail by way of Examples and Comparative Examples, but the present invention is not intended to be limited to the following Examples.

Example 1

Production of Dielectric Ceramic

Example 1-1

A dielectric ceramic containing $Mg_2SiO_4$ as a main component and containing a zinc oxide and a glass component as additives, which has a ZnO content of 16 parts by mass, a $B_2O_3$ content of 6.0 parts by mass, and a $CaCO_3$ content of 2.0 parts by mass, relative to 100 parts by mass of the main component, and has a content of a $SiO_2$—BaO—CaO—$Li_2O$ glass of 2.0 parts by mass relative to 100 parts by mass of a dielectric composition which has all the same additives but without the glass component, was produced by the procedure described below.

First, MgO and $SiO_2$, which are raw materials for the main component, were respectively weighed such that the mole number of magnesium atoms was twice the mole number of silicon atoms. Pure water was added to the weighed raw materials, and thus a slurry having a slurry concentration of 25 parts by mass was produced. This slurry was mixed by wet mixing with a ball mill for 16 hours, and then was dried for 24 hours at about 120° C. Thus, a mixed raw material powder was obtained. This mixed raw material powder was calcined at about 1,200° C. for 3 hours in air, and thus $Mg_2SiO_4$ crystals were obtained. Pure water was added to these $Mg_2SiO_4$ crystals, and thus a slurry having a slurry concentration of 25% was produced. This slurry was pulverized with a ball mill for 16 hours, and then was dried for 24 hours at 120° C. Thus, an $Mg_2SiO_4$ crystal powder, which is the main component of the dielectric ceramic composition, was produced.

Subsequently, ZnO, $B_2O_3$, $CaCO_3$, and a glass component, which are raw materials for the additives of the dielectric ceramic composition, were respectively incorporated to the $Mg_2SiO_4$ crystal powder thus obtained, and a mixture was produced. Thus, a powder of the dielectric ceramic composition was obtained. The respective amounts of incorporation of the components of the dielectric ceramic composition were adjusted to 16 parts by mass for ZnO, 6.0 parts by mass for $B_2O_3$, and 2.0 parts by mass for $CaCO_3$, relative to 100 parts by mass of the $Mg_2SiO_4$ crystal powder, and 2.0 parts by mass for the $SiO_2$—BaO—CaO—$Li_2O$ glass relative to 100 parts by mass of a dielectric ceramic composition which has all the same additives but without the glass component.

An organic binder and the like were added to the powder of the dielectric ceramic composition, and then this was subjected to sheet molding by a doctor blade method. Thus, a plural number of sheet-like molded bodies were produced. The plural sheet molded bodies were laminated, and the laminated body was formed into a substrate form by pressing. Thus, a sheet laminate molded body was produced. This sheet laminate molded body was cut to a desired size, and then the chip Was chamfered. The resultant was fired for 2.5 hours at a firing temperature (900° C.) at which Ag does not melt, and thus a dielectric ceramic was produced. The respective amounts of incorporation of $Mg_2SiO_4$, which is contained as the main component of the dielectric ceramic thus produced, and ZnO, $B_2O_3$, $CaCO_3$, and $SiO_2$—BaO—CaO—$Li_2O$ glass, which are contained as the additives, are presented in Table 1-1.

Examples 1-2 to 1-12, Comparative Examples 1-1 to 1-10

Dielectric ceramic compositions were respectively produced in the same manner as in Example 1-1, except that the content (mass %) of $Li_2O$ relative to the total amount of the dielectric ceramic composition was changed to the value indicated in Tables 1-1 and 1-2. Then, each of the dielectric ceramic compositions thus obtained was subjected to sheet molding, and a plural number of the sheet molded bodies thus obtained were laminated and then pressed. Thus, a sheet laminate molded body farmed into a substrate form was produced. This sheet laminate molded body was processed in the same manner as in Example 1-1, and thus the respective dielectric ceramics were obtained. The respective amounts of incorporation of $Mg_2SiO_4$, which is contained as the main component of the dielectric ceramic thus produced, and ZnO, $B_2O_3$, $CaCO_3$, $SiO_2$—BaO—CaO—$Li_2O$ glass, and $Li_2O$, which are contained as the additives, are presented in Tables 1-1 and 1-2.

TABLE 1-1

| | Main component Mg$_2$SiO$_4$ | Additive | | | | | ρs (g/cm³) | Relative density (3.35 g/cm³ is defined as 100%) | Q factor (@1.9 GHz) | Transverse rupture strength (MPa) | Base deformation/ sinterability | Amount of unreacted ZnO |
|---|---|---|---|---|---|---|---|---|---|---|---|---|
| | | ZnO | B$_2$O$_3$ | CaCO$_3$ | SiO$_2$—BaO—CaO—Li$_2$O glass | Li$_2$O | | | | | | |
| Example 1-1 | 100 | 16 | 6 | 2 | 2 | — | 3.34 | 99.7 | 1555 | 300 | No/Good | 0% |
| Example 1-2 | 100 | 16 | 6 | 2 | 3 | — | 3.35 | 100.0 | 1602 | 305 | No/Good | 0% |
| Example 1-3 | 100 | 16 | 6 | 2 | 4 | — | 3.36 | 100.3 | 1610 | 307 | No/Good | 0% |
| Example 1-4 | 100 | 16 | 6 | 2 | 5 | — | 3.35 | 100.0 | 1650 | 310 | No/Good | 0% |
| Example 1-5 | 100 | 16 | 6 | 2 | 6 | — | 3.37 | 100.6 | 1659 | 311 | No/Good | 0% |
| Example 1-6 | 100 | 16 | 6 | 2 | 7 | — | 3.36 | 100.3 | 1667 | 315 | No/Good | 0% |
| Example 1-7 | 100 | 12 | 6 | 2 | 2 | — | 3.36 | 100.3 | 1924 | 287 | No/Good | 0% |
| Example 1-8 | 100 | 12 | 6 | 2 | 3 | — | 3.37 | 100.6 | 1926 | 289 | No/Good | 0% |
| Example 1-9 | 100 | 12 | 6 | 2 | 4 | — | 3.35 | 100.0 | 1933 | 291 | No/Good | 0% |
| Example 1-10 | 100 | 12 | 6 | 2 | 5 | — | 3.36 | 100.3 | 1935 | 290 | No/Good | 0% |
| Example 1-11 | 100 | 12 | 6 | 2 | 6 | — | 3.34 | 99.7 | 1965 | 288 | No/Good | 0% |
| Example 1-12 | 100 | 12 | 6 | 2 | 7 | — | 3.37 | 100.6 | 1950 | 292 | No/Good | 0% |

TABLE 1-2

| | Main component Mg$_2$SiO$_4$ | Additive | | | | | ρs (g/cm³) | Relative density (3.35 g/cm³ is defined as 100%) | Q factor (@1.9 GHz) | Transverse rupture strength (MPa) | Base deformation/ sinterability | Amount of unreacted Zno |
|---|---|---|---|---|---|---|---|---|---|---|---|---|
| | | ZnO | B$_2$O$_3$ | CaCO$_3$ | SiO$_2$—BaO—CaO—Li$_2$O glass | Li$_2$O | | | | | | |
| Comparative Example 1-1 | 100 | 9 | 6 | 2 | 5 | — | 3.15 | 94.0 | 900 | 205 | No/Insufficient | 0% |
| Comparative Example 1-2 | 100 | 18 | 6 | 2 | 5 | — | 3.35 | 100.0 | 923 | 275 | No/Good | 17% |
| Comparative Example 1-3 | 100 | 12 | 4 | 2 | 5 | — | 3.21 | 95.8 | 600 | 205 | No/Insufficient | 0% |
| Comparative Example 1-4 | 100 | 12 | 9 | 2 | 5 | — | 3.18 | 94.9 | 700 | 210 | Yes/Insufficient | 0% |
| Comparative Example 1-5 | 100 | 12 | 6 | 2 | 0 | — | 2.65 | 79.1 | unmeasurable | unmeasurable | Insufficient | 0% |
| Comparative Example 1-6 | 100 | 12 | 6 | 2 | 1 | — | 2.76 | 82.4 | unmeasurable | unmeasurable | Insufficient | 0% |
| Comparative Example 1-7 | 100 | 16 | 6 | 2 | — | 0.38 | 3.23 | 96.4 | 462 | 250 | No/Good | 20% |
| Comparative Example 1-8 | 100 | 12 | 6 | 2 | — | 0.38 | 3.32 | 99.1 | 550 | 300 | No/Good | 20% |
| Comparative Example 1-9 | 100 | 12 | 6 | 2 | — | 1 | 3.35 | 100.0 | 450 | 310 | No/Good | 15% |
| Comparative Example 1-10 | 100 | 12 | 6 | 2 | — | 2 | 3.36 | 100.3 | 460 | 300 | Yes/Good | 15% |

Evaluation

Sintered density ρs, relative density (defined as 1009 when the sintered density is 3.35 g/cm³), Q factor and transverse rupture strength of the dielectric ceramic thus obtained, deformation of base material, sinterability, and the amount of ZnO relative to the main phase (referred to as "Amount of unreacted ZnO" in Tables 1-1 and 1-2) were respectively determined.

Measurement of Sintered Density ρs

A specimen obtained after firing was cut to a size of approximately 4.5×3.2×0.8 mm (length×width×thickness), and the dimensions in the respective directions were measured with a micrometer gauge. The mass of the specimen was measured with an electronic balance, and the bulk density obtained from these values was defined as the sintered density ρs (unit: g/cm$^3$). The measurement results are presented in Tables 1-1 and 1-2. In the present Example, when a dielectric ceramic composition which has the same composition of $Mg_2SiO_4$ as the main component and ZnO, $B_2O_3$, $CaCO_3$ and $SiO_2$—BaO—CaO—$Li_2O$ glass as the additives, as the dielectric ceramic compositions used for the production of the dielectric ceramics of Example 1-4, was used to measure the sintered density ρs by changing the firing temperature and time, the value of the sintered density ρs of the dielectric ceramic composition was 3.35 g/cm$^3$. Therefore, the value of the sintered density, 3.35 g/cm$^3$ obtained in Example 1-4 was used to define the relative density as 100%, and when the relative density was less than 96%, it was evaluated that the specimen was insufficiently sintered.

Q Factor

Characterization by X-Ray Diffraction of Amount of ZnO Remaining Unreacted

The sample obtained after firing was pulverized into a powder form using an agate mortar, and an X-ray diffraction (XRD) analysis was carried out by X-ray diffraction spectroscopy to measure the X-ray diffraction peak intensities. The XRD analysis was carried out using an X-ray diffraction apparatus (trade name: RINT2000/PC, manufactured by Rigaku corp.) which used a Cu vacuum tube. Example 1-4 and Comparative Example 1-7 were used as the measurement samples. The measurement conditions were as shown below. The X-ray diffraction spectra of Example 1-4 and Comparative Example 1-7 are presented in FIG. 6.

Measurement Conditions
Voltage: 50 kV
Current: 300 mA
Scan speed: 4°/min
Range: 2θ=10 to 70 (deg)

Figure 6:
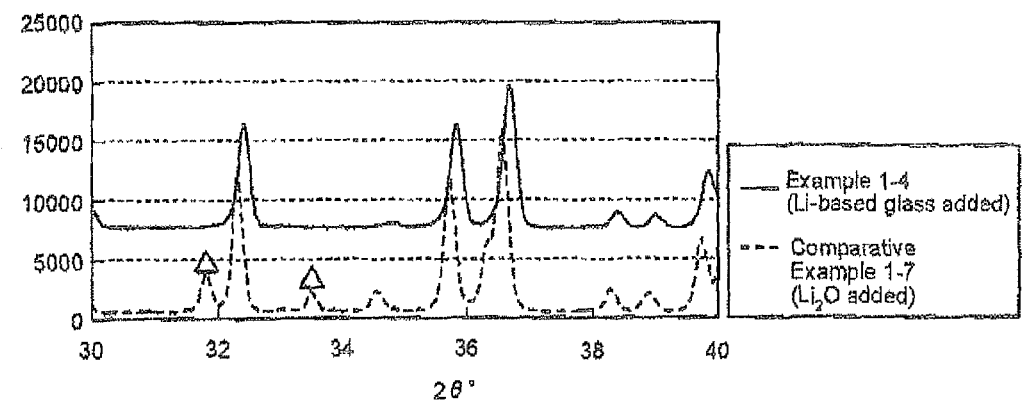
FIG. 6 is a set of X-ray diffraction spectra of Example 1-4 and Comparative Example 1-7.

As shown in FIG. 6, from the XRD measurement results, an X-ray diffraction peak intensity was confirmed at around 36.5° in Example 1-4, and an X-ray diffraction peak intensity $I_A$ was confirmed at around 36.4° in Comparative Example 1-7. This X-ray diffraction peak intensity $I_A$ may be considered to be attributable to $Mg_2SiO_4$, which is the main phase. In Comparative Example 1-7, X-ray diffraction peak intensities $I_B$ were confirmed at around 31.8° and around 33.6°. These X-ray diffraction peak intensities $I_B$ may be considered to be attributable to the ZnO that remained unreacted. On the other hand, in Example 1-4, no X-ray diffraction peak intensities $I_B$ were confirmed at around 31.8° and 33.6°. Therefore, in the dielectric ceramics which contained $Mg_2SiO_4$ as the main component and ZnO, $B_2O_3$, $CaCO_3$, and $SiO_2$—BaO—CaO—$Li_2O$ glass as the additives, the peak intensity ratio, $I_B/I_A$, of the X-ray diffraction peak intensity $I_B$ with respect to the X-ray diffraction peak intensity $I_A$ was 0%. On the other hand, in the dielectric ceramics which contained $Mg_2SiO_4$ as the main component and ZnO, $B_2O_3$, $CaCO_3$, and $Li_2O$ glass as the additives, the peak intensity ratio, $I_B/I_A$, of the X-ray diffraction peak intensity $I_B$ with respect to the X-ray diffraction peak intensity $I_A$ was about 15%. Therefore, it can be said that in a dielectric ceramic which contains $Mg_2SiO_4$ as the main component and ZnO, $B_2O_3$, $CaCO_3$, and $SiO_2$—BaO—CaO—$Li_2O$ glass as the additives, such as in the case of the dielectric ceramics of Example 1-4, the zinc oxide does not remain unreacted and undergoes complete reaction.

Measurement of Q Factor

The Q factor was measured by a cavity resonator perturbation method. A specimen which measured 0.8 mm on each edge was inserted into a cavity resonator, and the change in the Q factor inside the cavity resonator was measured. The measurement was carried out at a frequency of 1.9 GHz, and an average value of the Q factors obtained in three measurements was defined as the Q factor. The measurement results are presented in Tables 1-1 and 1-2.

Measurement of Transverse Rupture Strength

Each dielectric ceramic was cut to obtain a specimen having a thickness of approximately 0.4 mm and a width of approximately 2.6 mm, and the three-point flexural strength was measured. The three-point flexural strength was measured using an analyzer (trade name: 5543, manufactured by Instron, Inc.). The transverse rupture strength was determined from the measurement results obtained by the three-point flexural strength test. Measurement was carried out at 10 sites, with the distance between chucks at two points, which supported the specimen during the measurement, set to 15 mm, and the speed of measurement set to 0.5 mm/min. An average value of the values obtained by ten measurements (unit: MPa) was defined as the measurement value, The measurement results are presented in Tables 1-1 and 1-2.

Deformation of Base Material and Sinterability

Deformation of the base material was judged by visual inspection of each of the samples used in the measurement of the sintered density ρs. For an analysis of sinterability, each of the samples used in the measurement of the sintered density ρs was fractured, and the fractured surface was observed with a scanning electron microscope (SEM; trade name: JSM-6700, manufactured by JEOL Datum, Ltd.). Thus, it was determined whether sinterability was sufficient, based on the extent of the amount of pores relative to a sample having a relative density of 100%. The results are presented in Tables 1-1 and 1-2.

Amount of ZnO Remaining Unreacted with Respect to Main Phase

For the amount of ZnO that remained unreacted with respect to the main phase after firing, the X-ray diffraction peak intensity $I_A$ that is obtainable when 2θ of $Mg_2SiO_4$ included the main phase is between 36.0° and 37.0°, and the X-ray diffraction peak intensity $I_B$ that is obtainable when 2θ of ZnO remaining unreacted is between 31.0° and 32.0°, and between 33.0° and 34.0°, were determined, and the amount of ZnO was determined from the peak intensity ratio, $I_B/I_A$, of the X-ray diffraction peak intensity $I_B$ with respect to the X-ray diffraction peak intensity $I_A$. The measurement results are presented in Tables 1-1 and 1-2. A suitable range of this peak intensity ratio, $I_B/I_A$, was defined to be 10% or less As shown in Tables 1-1 and 1-2, in Examples 1-1 to 1-12, the values of the sintered density ρs are in the range of 3.35 g/cm$^3$±0.02 g/cm$^3$. Thus, when the value of the sintered density ρs of 3.35 g/cm$^3$ was defined as a relatively density of 100%, it was confirmed that the values of the relative density were all 99% or greater. At this time, it was confirmed that each of the dielectric ceramics of Examples 1 to 12 had a Q factor of 1,000 or greater and a transverse rupture strength of 280 MPa or greater, there was no deformation of the base material, and sinterability was also satisfactory. Furthermore, the amount of ZnO remaining unreacted with respect to the main phase after firing was confirmed to be 0% in all cases. Therefore, it can be said that when a Li-based glass such as $SiO_2$—BaO—CaO—$Li_2O$ glass is added, the amount of ZnO remaining unreacted can be suppressed, and a Q factor of 1,000 or greater can be obtained.

On the contrary, in Comparative Examples 1-1 and 1-3 to 1-6, it was confirmed that the values of the sintered density ρs were smaller than 3.35 g/cm³, and the values of the relative density were smaller than 96%. Particularly, when the value of the relative density was equal to or greater than 90% and less than 96%, it was confirmed that the Q factor and the transverse rupture strength were decreased, and although deformation of the base material did not occur in some cases, sintering was insufficiently achieved in all cases (see Comparative Examples 1-3 and 1-4). Also, when the value of the relative density was smaller than 90%, it was confirmed that the Q factor and the transverse rupture strength were not measurable, and sintering was insufficiently achieved (see Comparative Examples 1-5 and 1-6). At this time, it was confirmed that the amount of ZnO with respect to the main phase was 0% in all cases. This is believed to be because the dielectric ceramic compositions were insufficiently sintered, and thus dielectric ceramics could not be obtained. Furthermore, in Comparative Examples 1-2 and 1-7 to 1-10, it was confirmed that the values of the relative density were 96% or greater, but the Q factors were low, and the amounts of ZnO remaining unreacted with respect to the main phase were 15% or greater. This is believed to be because when $Li_2O$ is added, unreacted ZnO remains to a certain extent, and a Q factor of 1,000 or greater cannot be obtained. Therefore, even though the sintered density ρs is satisfactory, if the Q factor is low, it can be said that a dielectric ceramic has residual ZnO.

Therefore, it was found that when the entire amount of ZnO contained in a dielectric ceramic composition is fired, the peak intensity ratio, $I_B/I_A$, of the dielectric ceramic is adjusted to 10% or less, and also the relative density is adjusted to 96% or greater, sinterability of the dielectric ceramic thus obtainable can be secured, the transverse rupture strength can be maintained, and also the Q factor can be increased, so that the dielectric loss can be decreased.

Example 2

Production of Dielectric Ceramic

Example 2-1

A dielectric ceramic containing $Mg_2SiO_4$ as a main component and containing a zinc oxide and a glass component as additives, which has a ZnO content of 16 parts by mass, a $B_2O_3$ content of 6.0 parts by mass, a $CaCO_3$ content of 2.0 parts by mass, and an $Al_2O_3$ content of 0.5 parts by mass, relative to 100 parts by mass of the main component, and has a content of a $SiO_2$—BaO—CaO—$Li_2O$ glass of 5.0 parts by mass relative to 100 parts by mass of a dielectric composition which has all the same additives but without the glass component, was produced by the procedure described below.

First, an $Mg_2SiO_4$ crystal powder, which is a main component of the dielectric ceramic composition, was produced using MgO and $SiO_2$, which are raw materials for the main component. The method for producing the $Mg_2SiO_4$ crystal powder was carried out in the same manner as described in connection with Example 1, and thus further explanation will not be repeated.

Subsequently, ZnO, $B_2O_3$, $CaCO_3$, $Al_2O_3$ and a glass component, which are raw materials for the additives of the dielectric ceramic composition, were respectively incorporated to the $Mg_2SiO_4$ crystal powder thus obtained, and a mixture was produced. Thus, a powder of the dielectric ceramic composition was obtained. The respective amounts of incorporation of the components of the dielectric ceramic composition were adjusted to 16.0 parts by mass for ZnO, 6.0 parts by mass for $B_2O_3$, 2.0 parts by mass for $CaCO_3$, and 0.5 parts by mass of $Al_2O_2$, relative to 100 parts by mass of the $Mg_2SiO_4$ crystal powder, and 5.0 parts by mass for the $SiO_2$—BaO—CaO—$Li_2O$ glass relative to 100 parts by mass of a dielectric ceramic composition which has all, the same additives but without the glass component.

A dielectric ceramic was produced using the dielectric ceramic composition thus obtained. The method for producing the dielectric ceramic was carried out in the same manner as in the case described in connection with Example 1, and therefore, further explanation will not be repeated. The respective amounts of incorporation of $Mg_2SiO_4$, which is contained as the main component of the dielectric ceramic thus produced, and ZnO, $B_2O_3$, $CaCO_3$, $Al_2O_3$, and $SiO_2$—BaO—CaO—$Li_2O$ glass, which are contained as the additives, are presented in Table 2-1

Examples 2-2 to 2-4

Dielectric ceramic compositions were respectively produced in the same manner as in Example 2-1, except that the content ratio (parts by mass) of $Al_2O_3$ relative to the total amount of the dielectric ceramic composition were changed to the values indicated in Table 2-1. Then, each of the dielectric ceramic compositions thus obtained was subjected to sheet molding, and a plural number of the sheet molded bodies thus obtained were laminated and then pressed. Thus, a sheet laminate molded body formed into a substrate form was produced. This sheet laminate molded body was processed in the same manner as in Example 1, and thus the respective dielectric ceramics were obtained. The respective amounts of incorporation of $Mg_2SiO_4$, which is contained as the main component of the dielectric ceramic thus produced, and Zoo, $B_2O_3$, $CaCO_3$, $Al_2O_3$, and $SiO_2$—BaO—CaO—$Li_2O$ glass, which are contained as the additives, are presented in Table 2-1.

Examples 2-5 to 2-8

Dielectric ceramic compositions were respectively produced in the same manner as in Example 1, except that $TiO_2$ was used in place of $Al_2O_5$ as a sintering aid so as to incorporate $TiO_2$ as an additive instead of $Al_2O_3$, and the content ratio (parts by mass) of $TiO_2$ relative to the total amount of the dielectric ceramic composition was changed to the values indicated in Table 2-1. Then, each of the dielectric ceramic compositions thus obtained was subjected to sheet molding, and a plural number of the sheet molded bodies thus obtained were laminated and then pressed. Thus, a sheet laminate molded body formed into a substrate form was produced, This sheet laminate molded body was processed in the same manner as in Example 1, and thus the respective dielectric ceramics were obtained. The respective amounts of incorporation of $Mg_2SiO_4$, which is contained as the main component of the dielectric ceramic thus produced, and ZnO, $B_2O_3$, $CaCO_3$, $TiO_2$, and $SiO_2$—BaO-caO—$Li_2O$ glass, which are contained as the additives, are presented in Table 2-1.

TABLE 2-1

| | Main component Mg$_2$SiO$_4$ | Additive | | | | | | | Q factor (@1.9 GHz) | ρs (g/cm$^3$) |
| --- | --- | --- | --- | --- | --- | --- | --- | --- | --- | --- |
| | | ZnO | B$_2$O$_3$ | CaCO$_3$ | Al$_2$O$_3$ | TiO$_2$ | SiO$_2$—BaO—CaO—Li$_2$O glass | Li$_2$O | | |
| Example 2-1 | 100 | 16 | 6 | 2 | 0.5 | — | 5 | — | 1950 | 3.34 |
| Example 2-2 | 100 | 16 | 6 | 2 | 1 | — | 5 | — | 1960 | 3.33 |
| Example 2-3 | 100 | 16 | 6 | 2 | 2 | — | 5 | — | 2400 | 3.34 |
| Example 2-4 | 100 | 16 | 6 | 2 | 5 | — | 5 | — | 2100 | 3.32 |
| Example 2-5 | 100 | 16 | 6 | 2 | — | 0.5 | 5 | — | 1700 | 3.35 |
| Example 2-6 | 100 | 16 | 6 | 2 | — | 1 | 5 | — | 1980 | 3.36 |
| Example 2-7 | 100 | 16 | 6 | 2 | — | 2 | 5 | — | 2300 | 3.33 |
| Example 2-8 | 100 | 16 | 6 | 2 | — | 5 | 5 | — | 2040 | 3.28 |

Comparative Examples 2-1 to 2-4

Dielectric ceramic compositions were respectively produced in the same manner as in Example 2-1, except that Li$_2$O was used in place of the SiO$_2$—BaO—CaO—Li$_2$O glass as a sintering aid so as to incorporate Li$_2$O as an additive instead of the SiO$_2$—BaO—CaO—Li$_2$O glass, and the content ratio (parts by mass) of Li$_2$O relative to the total amount of the dielectric ceramic composition was changed to the values indicated in Table 2-2. Then, each of the dielectric ceramic compositions thus obtained was subjected to sheet molding, and a plural number of the sheet molded bodies thus obtained were laminated and then pressed. Thus, a sheet laminate molded body formed into a substrate form was produced. This sheet laminate molded body was processed in the same manner as in Example 2-1, and thus the respective dielectric ceramics were obtained. The respective amounts of incorporation of Mg$_2$SiO$_4$, which is contained as the main component of the dielectric ceramic thus produced, and ZnO, B$_2$O$_3$, CaCO$_3$, Al$_2$O$_3$, and Li$_2$O, which are contained as the additives, are presented in Table 2-2.

Comparative Examples 2-5 to 2-8

Dielectric ceramic compositions were respectively produced in the same manner as in Example 2-1, except that TiO$_2$ and Li$_2$O were used in place of Al$_2$O$_3$ and the SiO$_2$—BaO—CaO—Li$_2$O glass as sintering aids so as to incorporate TiO$_2$ and Li$_2$O as additives instead of Al$_2$O$_3$ and the SiO$_2$—BaO—CaO—Li$_2$O glass, and the content ratios (parts by mass) of TiO$_2$ and Li$_2$O relative to the total amount of the dielectric ceramic composition were respectively changed to the values indicated in Table 2-2. Then, each of the dielectric ceramic compositions thus obtained was subjected to sheet molding, and a plural number of the sheet molded bodies thus obtained were laminated and then pressed. Thus, a sheet laminate molded body formed into a substrate form was produced. This sheet laminate molded body was processed in the same manner as in Example 1, and thus the respective dielectric ceramics were obtained. The respective amounts of incorporation of Mg$_2$SiO$_4$, which is contained as the main component of the dielectric ceramic thus produced, and ZnO, B$_2$O$_3$, CaCO$_3$, TiO$_2$, and Li$_2$O, which are contained as the additives, are presented in Table 2-2.

TABLE 2-2

| | Main component Mg$_2$SiO$_4$ | Additive | | | | | | | Q factor (@1.9 GHz) | ρs (g/cm$^3$) |
| --- | --- | --- | --- | --- | --- | --- | --- | --- | --- | --- |
| | | ZnO | B$_2$O$_3$ | CaCO$_3$ | Al$_2$O$_3$ | TiO$_2$ | SiO$_2$—BaO—CaO—Li$_2$O glass | Li$_2$O | | |
| Comparative Example 2-1 | 100 | 16 | 6 | 2 | 0.5 | — | — | 0.38 | 800 | 3.33 |
| Comparative Example 2-2 | 100 | 16 | 6 | 2 | 1 | — | — | 0.82 | 750 | 3.32 |
| Comparative Example 2-3 | 100 | 16 | 6 | 2 | 2 | — | — | 1.2 | 650 | 3.33 |
| Comparative Example 2-4 | 100 | 16 | 6 | 2 | 5 | — | — | 5 | 500 | 3.32 |
| Comparative Example 2-5 | 100 | 16 | 6 | 2 | — | 0.5 | — | 0.38 | 765 | 3.31 |
| Comparative Example 2-6 | 100 | 16 | 6 | 2 | — | 1 | — | 0.82 | 721 | 3.33 |

TABLE 2-2-continued

| | Main component $Mg_2SiO_4$ | Additive | | | | | | | Q factor (@1.9 GHz) | ρs (g/cm³) |
|---|---|---|---|---|---|---|---|---|---|---|
| | | ZnO | $B_2O_3$ | $CaCO_3$ | $Al_2O_3$ | $TiO_2$ | $SiO_2$—BaO—CaO—$Li_2O$ glass | $Li_2O$ | | |
| Comparative Example 2-7 | 100 | 16 | 6 | 2 | — | 2 | — | 1.2 | 644 | 3.31 |
| Comparative Example 2-8 | 100 | 16 | 6 | 2 | — | 5 | — | 5 | 511 | 3.34 |

Evaluation

Sintered density ρs and the Q factor of each of the dielectric ceramics thus obtained were determined.

Sintered Density ρs

A specimen obtained after firing was cut to a size of approximately 4.5×3.2×0.8 mm (length×width×thickness), and the dimensions in the respective directions were measured with a micrometer gauge. The mass of the specimen was measured with an electronic balance, and the bulk density obtained from these values was defined as the sintered density ρs (unit: g/cm³). The measurement results are presented in Tables 2-1 and 2-2.

Q Factor

The Q factor was measured by a cavity resonator perturbation method. A specimen which measured 0.8 mm on each edge was inserted into a cavity resonator, and the change in the Q factor inside the cavity resonator was measured. The measurement was carried out at a frequency of 1.9 GHz, and an average value of the Q factors obtained in three measurements was defined as the Q factor. The measurement results are presented in As shown in Tables 2-1 and 2-2, it was confirmed that in Examples 2-1 to 2-7, the values of the sintered density ρs were in the range of 3.34 g/cm³±0.02 g/cm³, and in Example 2-8, the value of the sintered density ρs was as low as 3.28 g/cm³. Furthermore, it was confirmed that the respective dielectric ceramics of Examples 2-1 to 2-8 had Q factors of 1,000 or greater.

On the contrary, in Comparative Examples 2-1 to 2-8, it was confirmed that the values of the sintered density ρs were in the range of 3.31 g/cm³ to 3.34 g/cm³. Furthermore, it was confirmed that the respective dielectric ceramics of comparative Examples 2-1 to 2-8 had Q factors of 800 or greater.

Therefore, it was found that upon the production of a dielectric ceramic, when $Mg_2SiO_4$ is incorporated as a main component and a zinc oxide, a glass component, and an aluminum, oxide or a titanium oxide are incorporated as additives, the dielectric ceramic thus obtainable has en increased Q factor, and therefore, the dielectric loss can be made small.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A dielectric ceramic comprising:
   a main component which contains $Mg_2SiO_4$; and
   additives which contain a zinc oxide, a boron oxide, an alkaline earth metal oxide, and a glass component,
   wherein:
   in X-ray diffraction, a peak intensity ratio $I_B/I_A$ is 10% or less where $I_A$ is an X-ray diffraction peak intensity of $Mg_2SiO_4$ as a main phase for which 2θ is between 36.0° and 37.0° and $I_B$ is an X-ray diffraction peak intensity of unreacted zinc oxide for which 2θ is between 31.0° and 32.0° and between 33.0° and 34.0°,
   the glass component is $SiO_2$—BaO—CaO—$Li_2O$ glass,
   a content of the zinc oxide, as determined by calculating a mass of the zinc oxide relative to ZnO, is from 8.0 parts by mass to 20 parts by mass relative to 100 parts by mass of the main component,
   a content of the glass component, as determined by calculating a mass of the glass component relative to $SiO_2$—BaO—CaO—$Li_2O$ glass, is from 2.0 parts by mass to 10.0 parts by mass relative to 100 parts by mass of a dielectric composition having all the same additives but without the glass component,
   a content of the boron oxide, as determined by calculating a mass of the boron oxide relative to $B_2O_3$, is from 3.0 parts by mass to 10.0 parts by mass relative to 100 parts by mass of the main component,
   a content of the alkaline earth metal oxide, as determined by calculating a mass of the alkaline earth metal oxide relative to RO, where R represents an alkaline earth metal element, is from 1.0 parts by mass to 4.0 parts by mass relative to 100 parts by mass of the main component, and
   the dielectric ceramic has a relative density of 96% or greater.

2. The dielectric ceramic according to claim 1, wherein the content of the zinc oxide is from 10 parts by mass to 16 parts by mass.

3. An electronic component comprising a dielectric layer formed of the dielectric ceramic according to claim 1.

4. A dielectric ceramic comprising:
   a main component which contains $Mg_2SiO_4$; and
   additives which contain a zinc oxide, a glass component, a boron oxide, an alkaline earth metal oxide, and at least one of an aluminum oxide and a titanium oxide, wherein:
   the glass component is $SiO_2$—BaO—CaO—$Li_2O$ glass,
   a content of the zinc oxide, as determined by calculating a mass of the zinc oxide relative to ZnO, is from 8.0 parts by mass to 20 parts by mass relative to 100 parts by mass of the main component,
   a content of the glass component, as determined by calculating a mass of the glass component relative to $SiO_2$—BaO—CaO—$Li_2O$ glass, is from 2.0 parts by mass to 10.0 parts by mass relative to 100 parts by mass of a dielectric composition having all the same additives but without the glass component,
   a content of the boron oxide, as determined by calculating a mass of the boron oxide relative to $B_2O_3$, is from 3.0 parts by mass to 10.0 parts by mass relative to 100 parts by mass of the main component, a content of the alkaline earth metal oxide, as determined by calculating a mass of the alkaline earth metal oxide relative to RO, where R represents an alkaline earth metal element, is from 1.0 parts by mass to 4.0 parts by mass relative to 100 parts by mass of the main component, a content of the aluminum oxide, as determined by calculating a mass of the aluminum oxide relative to $Al_2O_3$, is from 0.1 parts by mass to 10.0 parts by mass relative to 100 parts by mass of the main component, and a content of the titanium oxide, as determined by calculating a mass of the titanium oxide relative to $TiO_2$, is from 0.1 parts by mass to 10.0 parts by mass relative to 100 parts by mass of the main component.

5. The dielectric ceramic according to claim 4, wherein the content of the zinc oxide is from 10 parts by mass to 16 parts by mass.

6. An electronic component comprising a dielectric layer formed of the dielectric ceramic according to claim 4.

7. A method for producing the dielectric ceramic of claim 1, the method comprising:
   a dielectric ceramic composition production process that includes mixing a raw material powder of magnesium oxide and a raw material powder of silicon dioxide, heat treating the mixture to produce an $Mg_2SiO_4$ crystal powder, adding the zinc oxide and the glass component as additive raw material powders to the $Mg_2SiO_4$ crystal powder, and thereby obtaining a dielectric ceramic composition; and
   a firing process that includes firing the dielectric ceramic composition at a temperature of from 800° C. to 1000° C. in an oxygen atmosphere, and thereby obtaining a sintered body, wherein:
   in X-ray diffraction, a peak intensity ratio $I_B/I_A$ is 10% or less where IA is an X-ray diffraction peak intensity of $Mg_2SiO_4$ as a main phase of the sintered body for which $2\theta$ is between 36.0° and 37.0° and $I_B$ is an X-ray diffraction peak intensity of zinc oxide remaining unreacted for which $2\theta$ is between 31.0° and 32.0° and between 33.0° and 34.0°, and
   the dielectric ceramic has a relative density of 96% or greater.

8. The method for producing a dielectric ceramic according to claim 7, wherein a content of the zinc oxide is from 10 parts by mass to 16 parts by mass.

9. A method for producing the dielectric ceramic of claim 4, the method comprising:
   a dielectric ceramic composition production process that includes mixing a raw material powder of magnesium oxide and a raw material powder of silicon dioxide, heat treating the mixture to produce an $Mg_2SiO_4$ crystal powder, adding the at least one of the aluminum oxide and the titanium oxide, the zinc oxide and the glass component as additive raw material powders to the $Mg_2SiO_4$ crystal powder, and thereby obtaining a dielectric ceramic composition; and
   a firing process that includes firing the dielectric ceramic composition at a temperature of from 800° C. to 1000° C. in an oxygen atmosphere, and thereby obtaining a sintered body.

10. The method for producing a dielectric ceramic according to claim 9, wherein a content of the zinc oxide is from 10 parts by mass to 16 parts by mass.

* * * * *